United States Patent
Yoshida

(10) Patent No.: US 9,543,194 B2
(45) Date of Patent: Jan. 10, 2017

(54) SEMICONDUCTOR DEVICE AND METHOD OF MANUFACTURING THE SAME

(71) Applicant: KABUSHIKI KAISHA TOSHIBA, Minato-ku (JP)

(72) Inventor: Kiyomitsu Yoshida, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/641,718

(22) Filed: Mar. 9, 2015

(65) Prior Publication Data

US 2016/0163581 A1 Jun. 9, 2016

Related U.S. Application Data

(60) Provisional application No. 62/088,076, filed on Dec. 5, 2014.

(51) Int. Cl.
| | |
|---|---|
| H01L 21/768 | (2006.01) |
| H01L 23/528 | (2006.01) |
| H01L 23/532 | (2006.01) |
| H01L 23/522 | (2006.01) |

(52) U.S. Cl.
CPC ..... *H01L 21/7682* (2013.01); *H01L 21/76802* (2013.01); *H01L 21/76829* (2013.01); *H01L 21/76834* (2013.01); *H01L 21/76877* (2013.01); *H01L 23/5222* (2013.01); *H01L 23/53295* (2013.01); *H01L 23/53238* (2013.01); *H01L 2924/0002* (2013.01)

(58) Field of Classification Search
CPC .. H01L 23/528; H01L 21/764; H01L 21/7682; H01L 29/0649; H01L 29/4991; H01L 2221/1042
See application file for complete search history.

(56) References Cited

U.S. PATENT DOCUMENTS

| | | | |
|---|---|---|---|
| 8,026,150 B2 | 9/2011 | Sasahara et al. | |
| 2005/0277284 A1 | 12/2005 | Iguchi | |
| 2013/0015518 A1* | 1/2013 | Sato | H01L 21/28273 257/321 |

FOREIGN PATENT DOCUMENTS

| | | |
|---|---|---|
| JP | 7-44178 | 5/1995 |
| JP | 7-326670 | 12/1995 |
| JP | 2005-354046 | 12/2005 |
| JP | 2008-243907 | 10/2008 |
| JP | 2009-54664 | 3/2009 |
| JP | 5342811 | 11/2013 |

\* cited by examiner

*Primary Examiner* — Jerome Jackson, Jr.
*Assistant Examiner* — David Spalla
(74) *Attorney, Agent, or Firm* — Oblon, McClelland, Maier & Neustadt, L.L.P.

(57) ABSTRACT

In one embodiment, a semiconductor device includes a first insulator, and conductors and second insulators alternately provided on the first insulator. Each second insulator of the second insulators has a first side face adjacent to one of the conductors via a first air gap, a second side face adjacent to one of the conductors via a second air gap, first lower faces in contact with the first insulator, and second lower faces provided above the first insulator via third air gaps.

11 Claims, 33 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/088,076 filed on Dec. 5, 2014, the entire contents of which are incorporated herein by reference.

FIELD

Embodiments described herein relate to a semiconductor device and a method of manufacturing the same.

BACKGROUND

When interconnects adjacent to one another are formed, it is considered to form air gaps between the interconnects to reduce the capacitance between the interconnects. An example of such interconnects is bit lines in a NAND memory. When the air gaps are formed between the interconnects, it is desirable to use such a method of forming the air gaps that can further largely reduce the capacitance between the interconnects. The same holds true for the case where the air gaps are formed between conductors other than the interconnects.

DETAILED DESCRIPTION

Embodiments will now be explained with reference to the accompanying drawings.

In one embodiment, a semiconductor device includes a first insulator, and conductors and second insulators alternately provided on the first insulator. Each second insulator of the second insulators has a first side face adjacent to one of the conductors via a first air gap, a second side face adjacent to one of the conductors via a second air gap, first lower faces in contact with the first insulator, and second lower faces provided above the first insulator via third air gaps.

First Embodiment (1) Structure of Semiconductor Device of First Embodiment

Figure 1A:
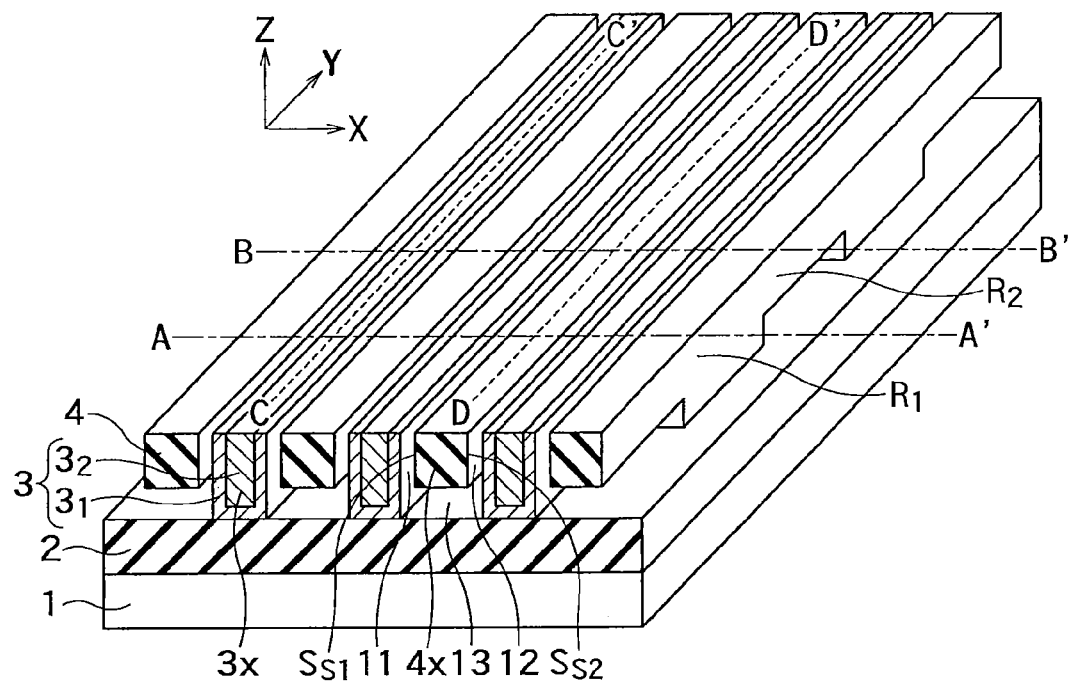
FIGS. 1A and 1B are a perspective view and a cross-sectional view illustrating a structure of a semiconductor device of a first embodiment.
Figure 1B:
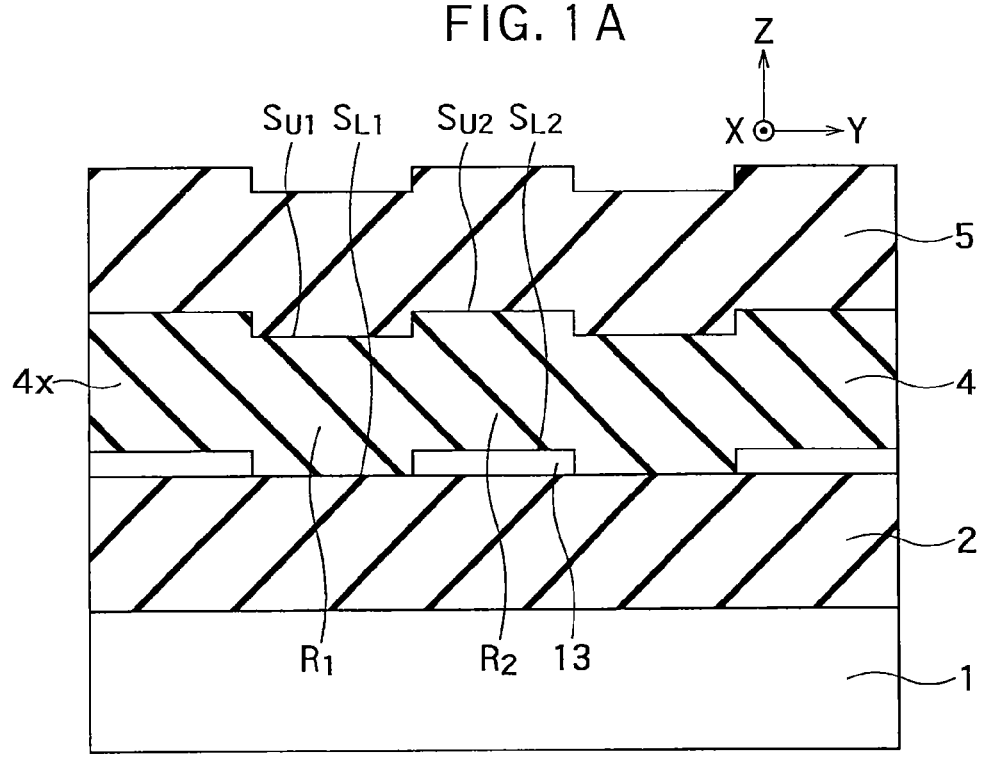

FIGS. 1A and 1B are a perspective view and a cross-sectional view illustrating a structure of a semiconductor device of a first embodiment. FIG. 1B illustrates a cross section taken along the D-D' line in FIG. 1A.

The semiconductor device of the present embodiment includes a substrate 1, a first insulator 2, conductors 3, second insulators 4 and a third insulator 5. In FIG. 1A, illustration of the third insulator 5 is omitted for convenience of drawing. Furthermore, in FIG. 1A, illustration of roughness on upper faces of the conductors 3 and roughness on upper faces of the second insulators 4 is omitted. The roughness on the upper faces of the second insulators 4 is illustrated in FIG. 1B.

An example of the substrate 1 is a semiconductor substrate such as a silicon substrate. FIGS. 1A and 1B illustrate an X direction and a Y direction parallel to a surface of the substrate 1 and perpendicular to each other, and a Z direction perpendicular to the surface of the substrate 1. In the specification, a +Z direction is regarded as an upward direction and a −Z direction is regarded as a downward direction. For example, positional relation between the substrate 1 and the first insulator 2 is expressed as that the substrate 1 is positioned below the first insulator 2. The −Z direction of the present embodiment may coincide with the direction of the gravity or may not coincide with the direction of the gravity.

The first insulator 2 is formed on the substrate 1. Examples of the first insulator 2 are a silicon oxide film and a silicon nitride film. The first insulator 2 may be directly formed on the substrate 1 or may be formed on the substrate 1 via another layer. Moreover, the first insulator 2 may be an insulating substrate in place of being an insulator on the substrate 1.

The conductors 3 and the second insulators 4 are alternately formed on the first insulator 2. The conductors 3 and the second insulators 4 extend in the Y direction and are alternately disposed along the X direction. An example of the conductors 3 is a metal interconnect. Examples of the second insulators 4 are a silicon oxide film and a silicon nitride film.

The third insulator 5 is formed on the conductors 3 and the second insulators 4. Examples of the third insulator 5 are a silicon oxide film, a silicon nitride film, a silicon carbide nitride film and the like.

Sign $3x$ designates one arbitrary conductor 3. The conductor $3x$ has a first conductor $3_1$ and a second conductor $3_2$. The first conductor $3_1$ is formed on the first insulator 2 and constitutes a lower face and side faces of the conductor $3x$. An example of the first conductor $3_1$ is a barrier metal layer such as a titanium (Ti) layer and a tantalum (Ta) layer. The second conductor $3_2$ is formed on the first conductor $3_1$ and constitutes an upper face of the conductor $3x$. An example of the second conductor $3_2$ is a interconnect material layer such as a copper (Cu) layer.

Sign 4x designates one arbitrary second insulator 4. As illustrated in FIG. 1A, the second insulator 4x has a first side face $S_{S1}$ adjacent to one conductor 3 via a first air gap 11 and a second side face $S_{S2}$ adjacent to another conductor 3 via a second air gap 12. The first and second side faces $S_{S1}$ and $S_{S2}$ of the second insulator 4x are separated from these conductors 3 with the first and second air gaps 11 and 12.

As illustrated in FIGS. 1A and 1B, the second insulator 4x alternately has first regions $R_1$ each of which has a first lower face $S_{L1}$ and a first upper face $S_{U1}$, and second regions $R_2$ each of which has a second lower face $S_{L2}$ and a second upper face $S_{U2}$. The first lower face $S_{L1}$ of each first region $R_1$ is in contact with the first insulator 2. The second lower face $S_{L2}$ of each second region $R_2$ is formed above the first insulator 2 via a third air gap 13. As illustrated in FIG. 1B, a height of the second upper face $S_{U2}$ is higher than a height of the first upper face $S_{U1}$.

The second insulator 4x is formed above the first insulator 2 via the third air gaps 13. As illustrated in FIG. 1A, these third air gaps 13 are connected to the first and second air gaps 11 and 12.

A width of each first region $R_1$ and a width of each second region $R_2$ may be configured as any widths as long as collapse of the second insulator 4x can be prevented. According to the present embodiment, by lengthening the width of each second region $R_2$, the volume of the third air gaps 13 can be increased, which can further largely reduce the capacitance between the conductors 3.

Figure 2A:
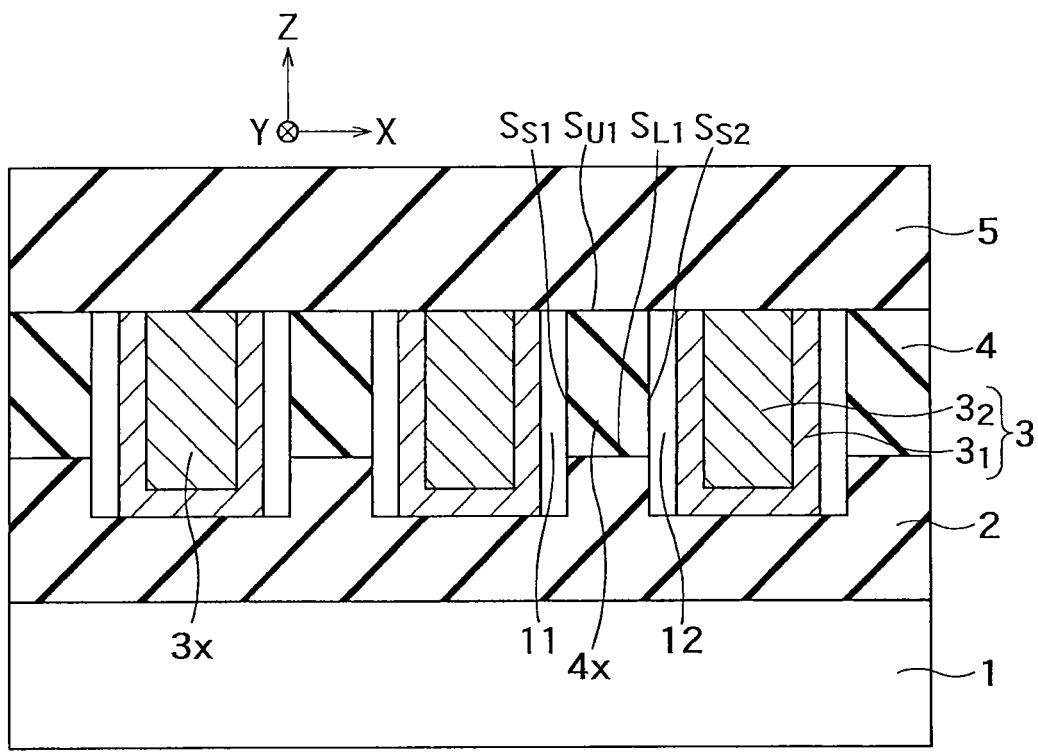
FIGS. 2A and 2B are cross-sectional views illustrating the structure of the semiconductor device of the first embodiment.
Figure 2B:
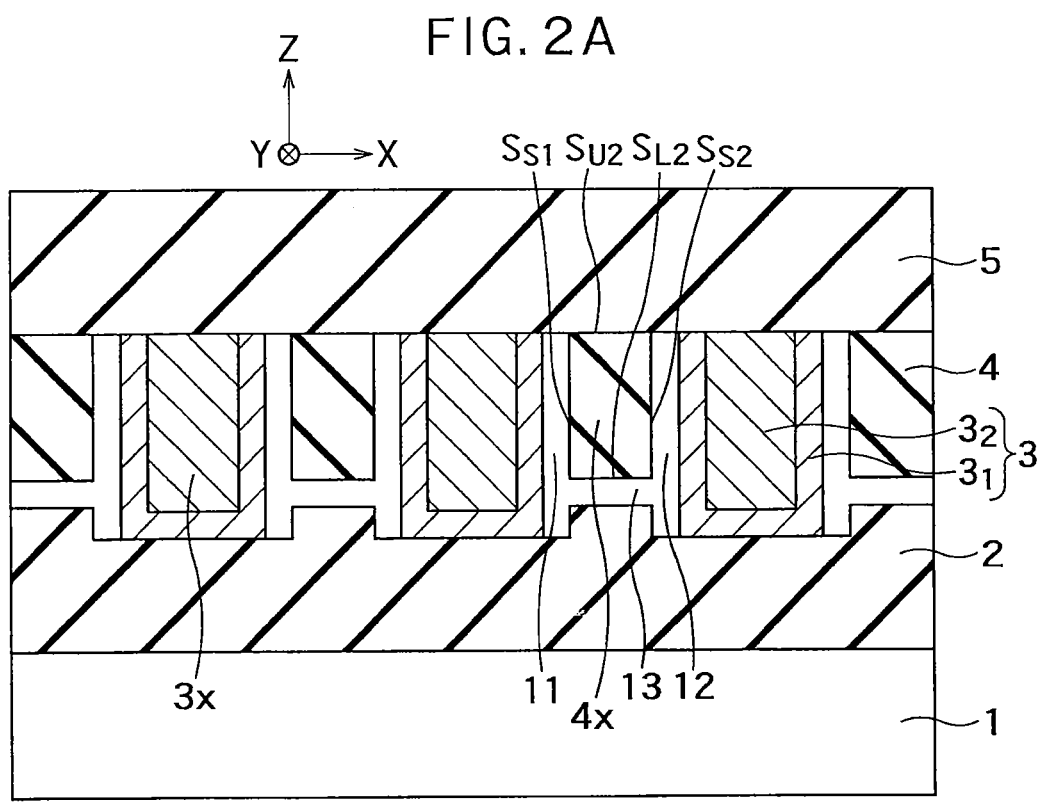

FIGS. 2A and 2B are cross-sectional views illustrating the structure of the semiconductor device of the first embodiment. FIG. 2A illustrates a cross section taken along the A-A' line in FIG. 1A, that is, a cross section of the first regions $R_1$. FIG. 2B illustrates a cross section taken along the B-B' line in FIG. 1A, that is, a cross section of the second regions $R_2$.

As illustrated in FIGS. 2A and 2B, the lower faces of the conductors 3 of the present embodiment are configured to be lower than the uppermost face of the first insulator 2. Illustration of this structure is omitted in FIG. 1A. Details of a semiconductor manufacturing process by which the structure is realized are mentioned later.

Figure 3:
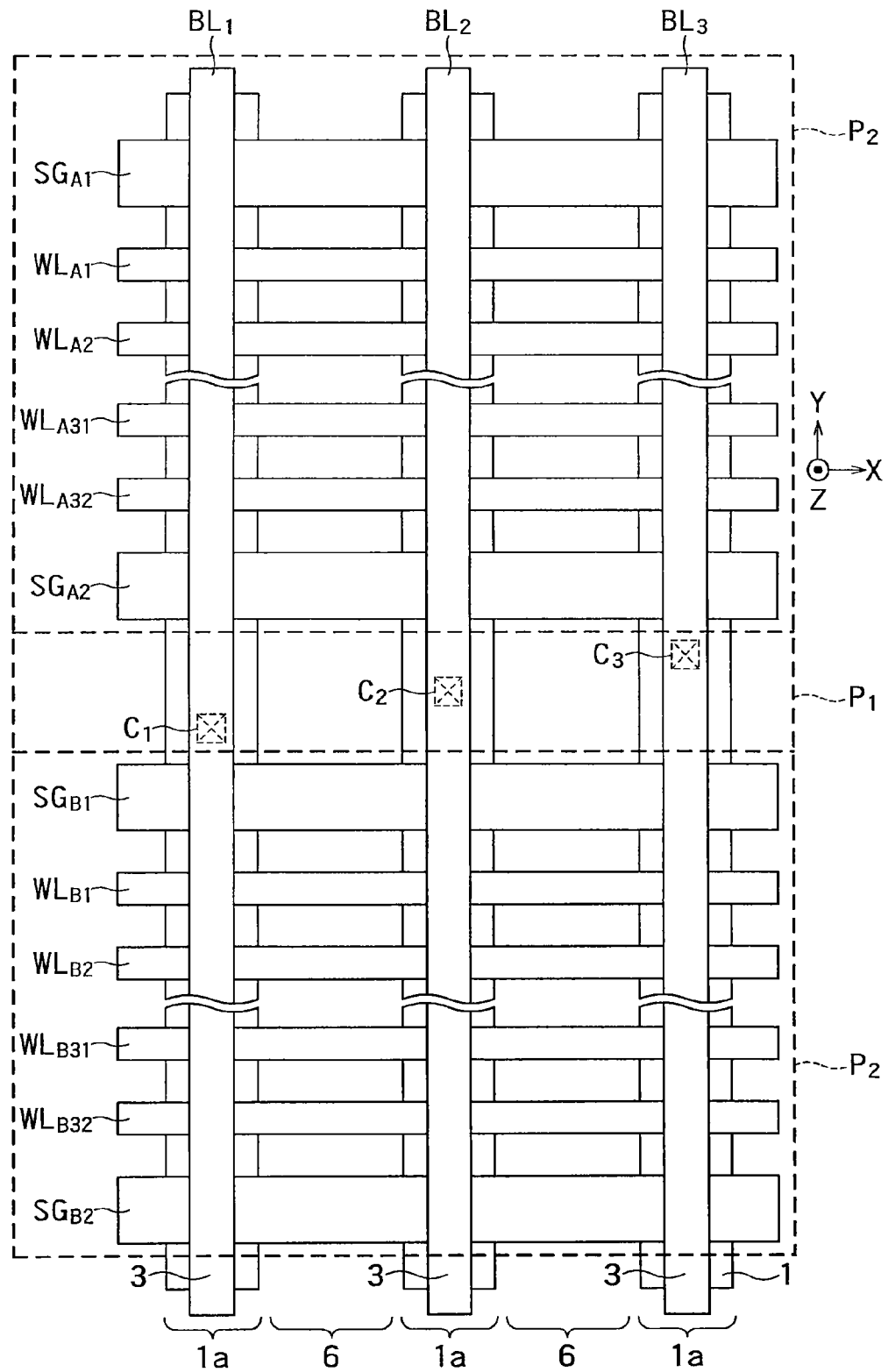
FIG. 3 is a plan view illustrating a specific example of the semiconductor device of the first embodiment.

FIG. 3 is a plan view illustrating a specific example of the semiconductor device of the first embodiment. FIG. 3 illustrates a memory cell region of a NAND memory.

The semiconductor device in FIG. 3 includes the substrate 1 that has device regions 1a, and isolation regions 6. The device regions 1a and the isolation regions 6 extend in the Y direction and are alternately disposed along the X direction. Furthermore, the semiconductor device in FIG. 3 includes word lines $WL_{A1}$ to $WL_{A32}$ and $WL_{B1}$ to $WL_{B32}$, select gates (select lines) $SG_{A1}$, $SG_{A2}$, $SG_{B1}$ and $SG_{B2}$, bit lines $BL_1$ to $BL_3$, and bit line contacts $C_1$ to $C_3$. The bit lines $BL_1$ to $BL_3$ are examples of the conductors 3 of the present embodiment.

FIG. 3 illustrates a region $P_2$ including the word lines $WL_{A1}$ to $WL_{A32}$ and the select gates $SG_{A1}$ and $SG_{A2}$, a region $P_2$ including the word lines $WL_{B1}$ to $WL_{B32}$ and the select gates $SG_{B1}$ and $SG_{B2}$, and a contact region $P_1$ provided between these regions $P_2$. The contact region $P_1$ includes the bit line contacts $C_1$ to $C_3$ between the device regions is and the bit lines $BL_1$ to $BL_3$.

When the first embodiment is applied to the NAND memory in FIG. 3, the second insulator 4x is formed, for example, so as to have the first region $R_1$ in the contact region $P_1$, and to have the second regions $R_2$ in the regions $P_2$. In this case, the third air gaps 13 are formed only in the regions $P_2$ of the regions $P_1$ and $P_2$.

(2) Method of Manufacturing Semiconductor Device of First Embodiment

FIGS. 4A to 18D are cross-sectional views illustrating a method of manufacturing the semiconductor device of the first embodiment.

Figure 4A:
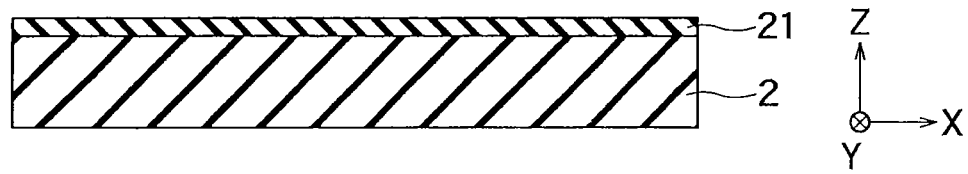
FIGS. 4A to 18D are cross-sectional views illustrating a method of manufacturing the semiconductor device of the first embodiment.
Figure 4B:
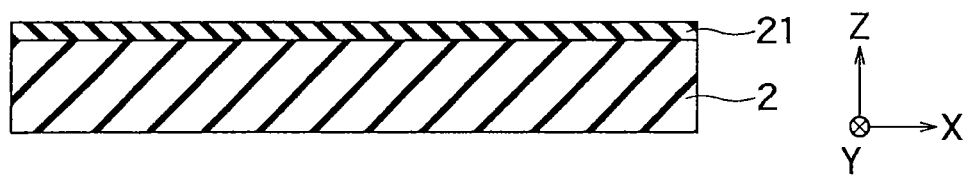
Figure 4C:
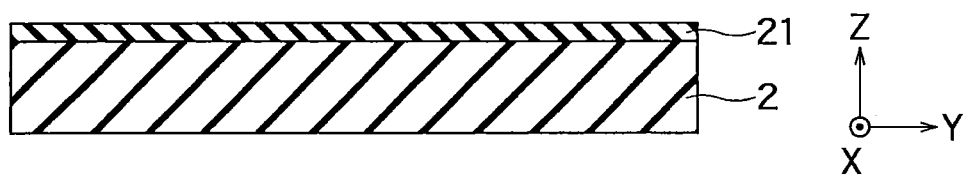
Figure 4D:
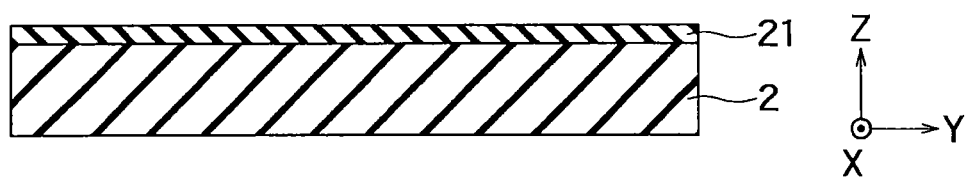
Figure 5A:
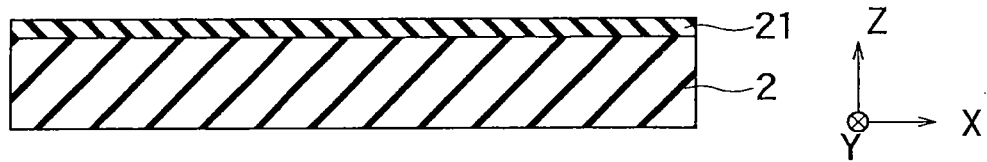
Figure 5B:
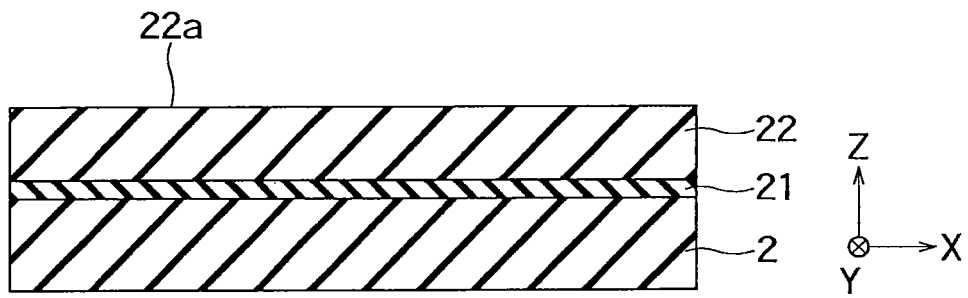
Figure 5C:
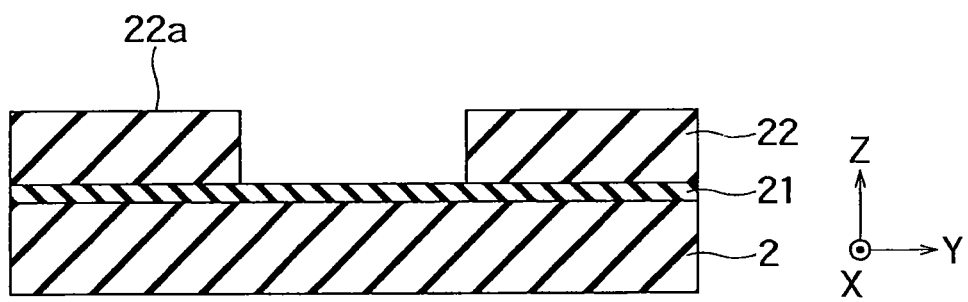
Figure 5D:
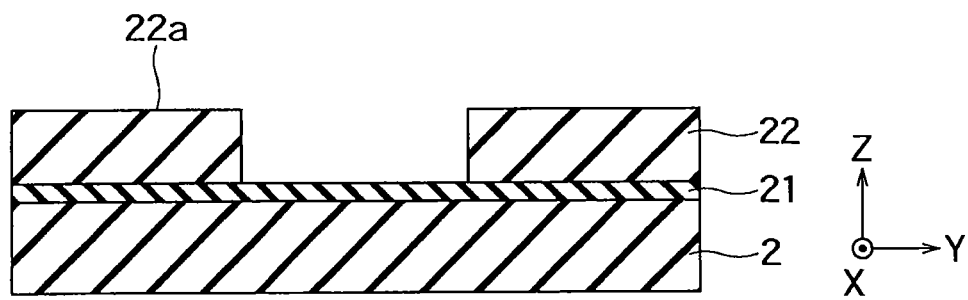
Figure 6A:
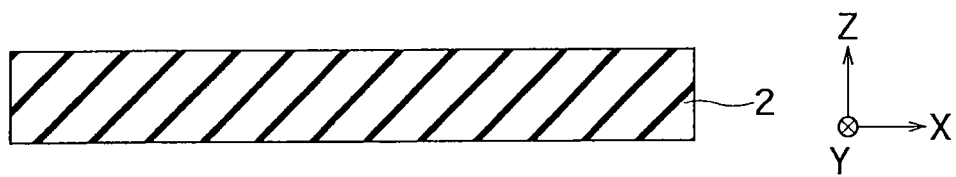
Figure 6B:
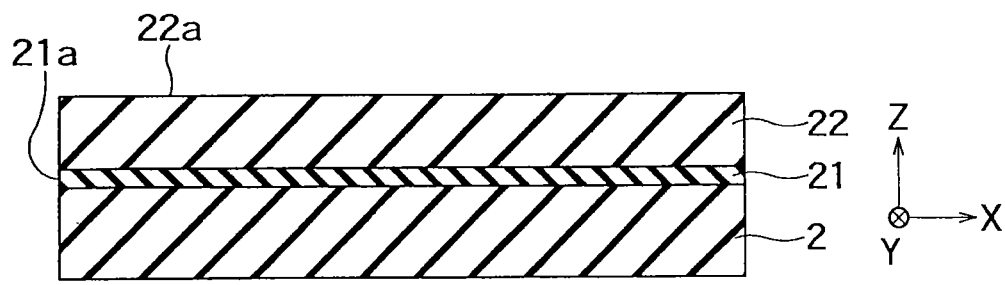
Figure 6C:
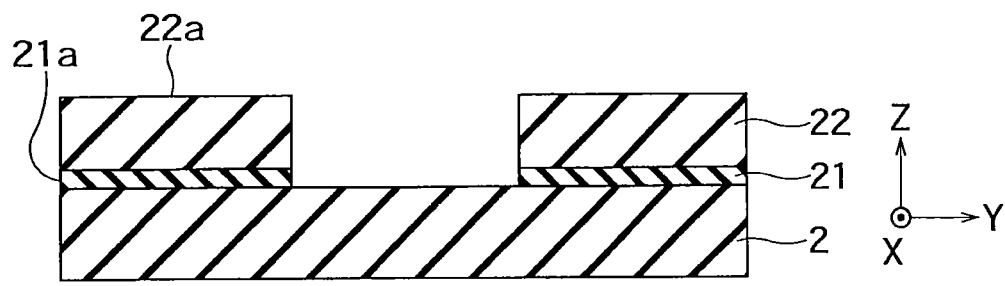
Figure 6D:
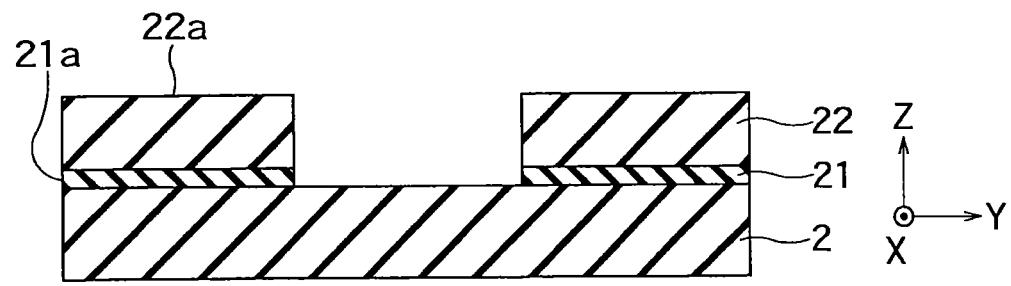
Figure 7A:
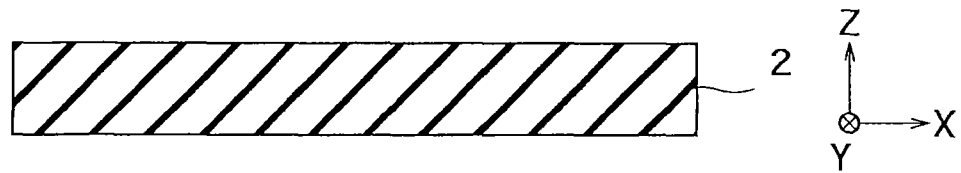
Figure 7B:
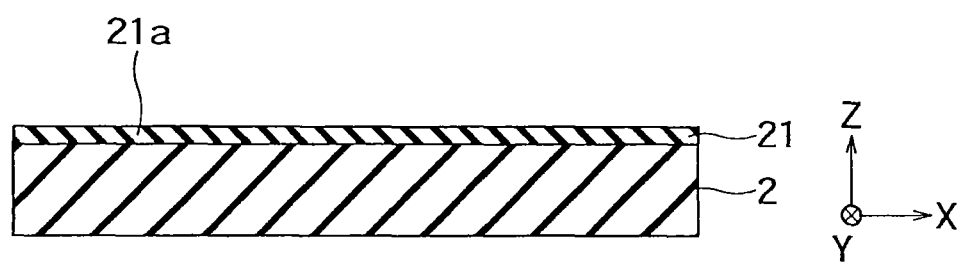
Figure 7C:
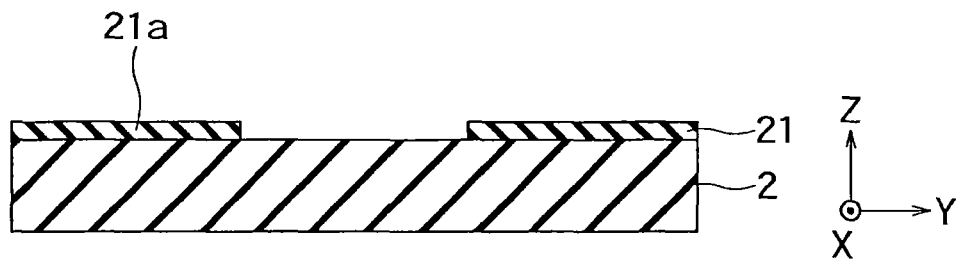
Figure 7D:
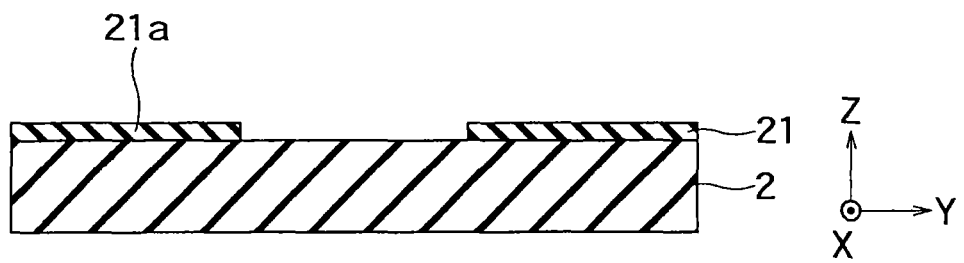

FIG. 4A illustrates a cross section taken along the A-A' line in FIG. 1A (cross section of the first regions $R_1$), and FIG. 4B illustrates a cross section taken along the B-B' line in FIG. 1A (cross section of the second regions $R_2$). Moreover, FIG. 4C illustrates a cross section taken along the C-C' line in FIG. 1A (cross section of the conductor 3x), and FIG. 4D illustrates a cross section taken along the D-D' line in FIG. 1A (cross section of the second insulator 4x). The same holds true for FIG. 5A to FIG. 18D.

First, the first insulator 2 is formed on the substrate 1 which is not shown and a first sacrificial layer 21 is formed on the first insulator 2 (FIGS. 4A to 4D). The first sacrificial layer 21 is an example of a first film. The first sacrificial layer 21 is, for example, an amorphous silicon layer.

Next, a resist film 22 is formed on the first sacrificial layer 21 and patterning of the resist film 22 is performed by lithography (FIGS. 5A to 5D). Sign 22a designates patterns of the resist film 22 formed in this process. These patterns 22a extend in the X direction and are processed into shapes including formation scheduled regions of the second regions $R_2$.

Next, the first sacrificial layer 21 is etched using the resist film 22 as a mask (FIGS. 6A to 6D). As a result, the first sacrificial layer 21 is processed into a shape in which the upper face of the first insulator 2 is partially covered. Sign 21a designates patterns of the first sacrificial layer 21 formed in this process. These patterns 21a extend in the X direction and are processed into shapes including the formation scheduled regions of the second regions $R_2$.

Next, the resist film 22 is removed (FIGS. 7A to 7D).

Next, an insulating material 4' for forming the second insulators 4 is formed on the first insulator 2 and the first sacrificial layer 21 (FIGS. 8A to 8D).

Next, a resist film 23 is formed on the insulating material 4' and patterning of the resist film 23 is performed by lithography (FIGS. 9A to 9D). Sign 23a designates patterns of the resist film 23 formed in this process. These patterns 23a extend in the Y direction and are processed into shapes including formation scheduled regions of the second insulators 4.

Figure 10A:
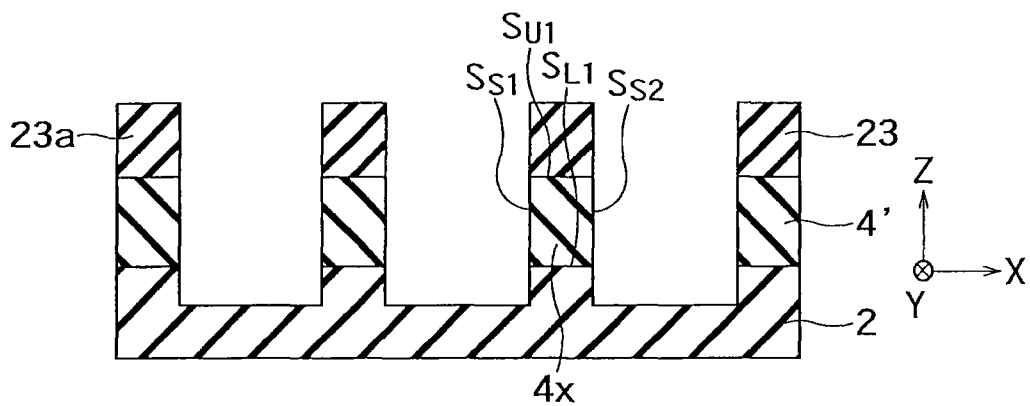
Figure 10B:
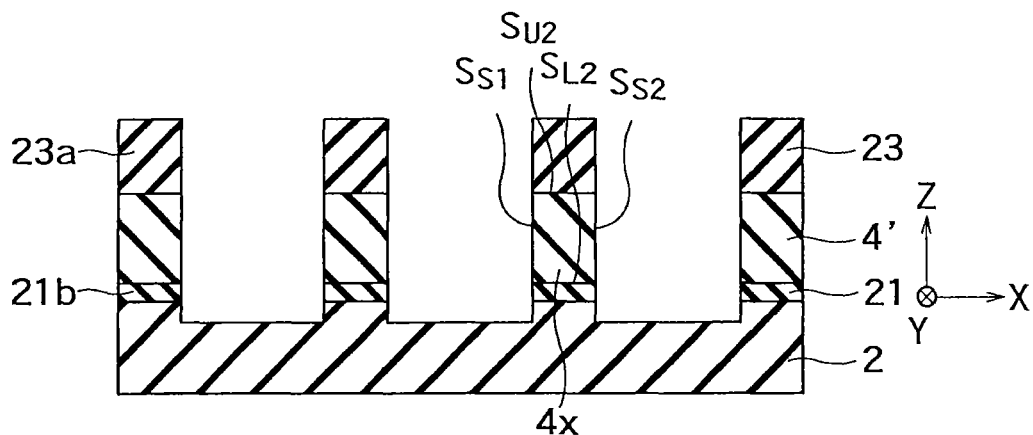
Figure 10C:
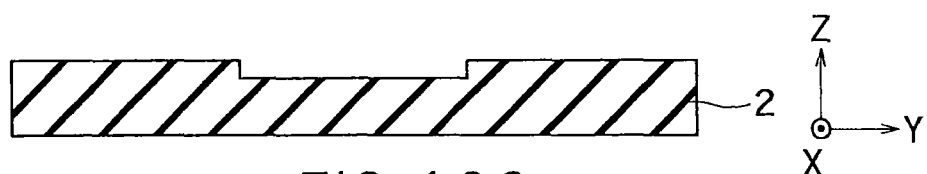
Figure 10D:
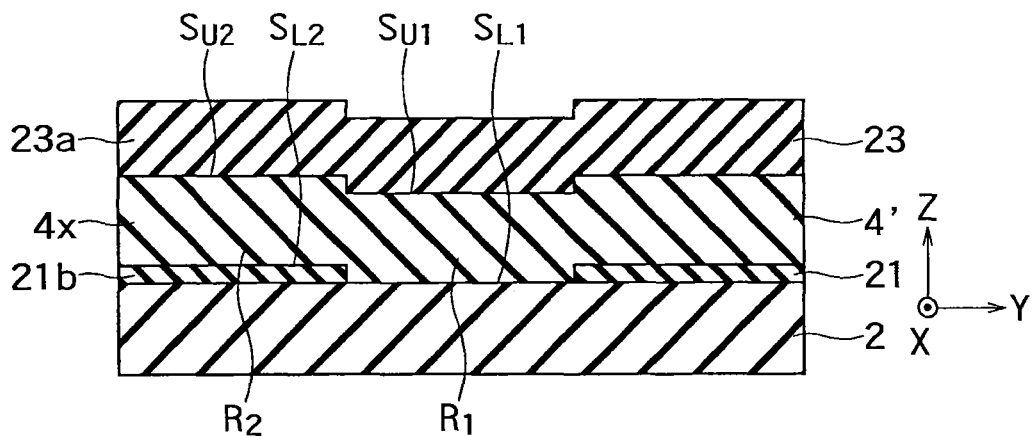
Figure 11A:
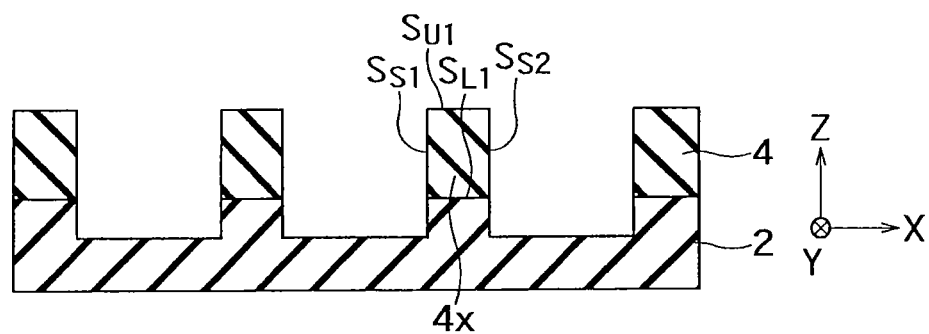
Figure 11B:
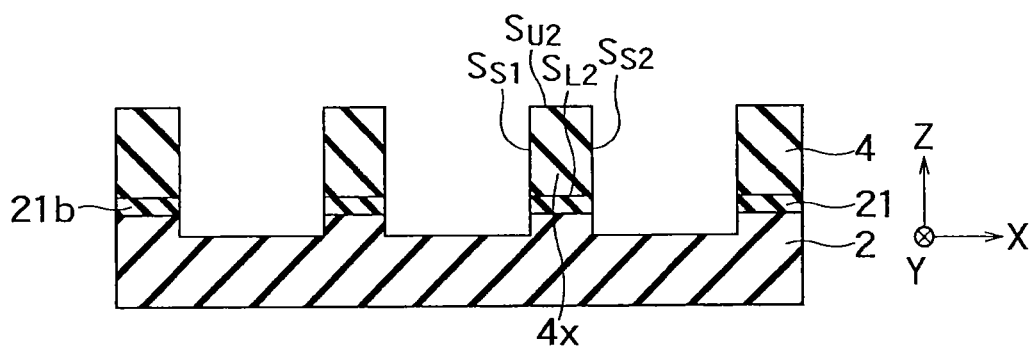
Figure 11C:
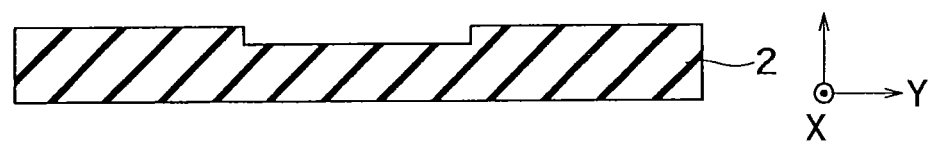
Figure 11D:
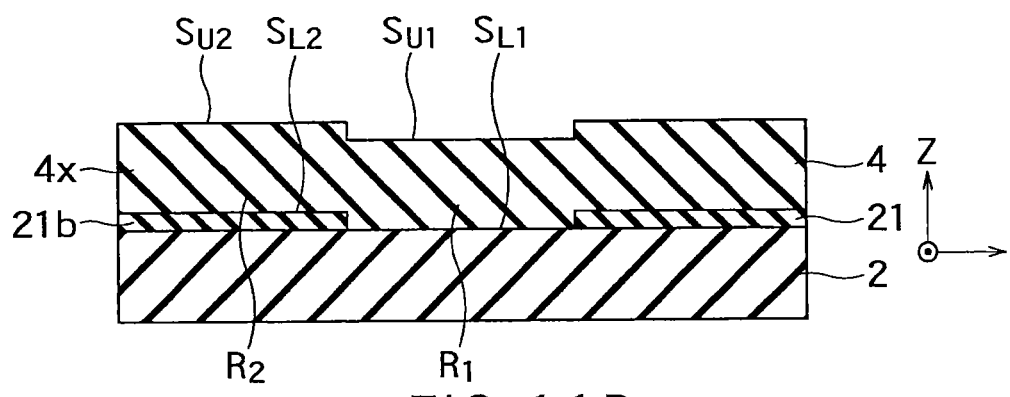
Figure 12A:
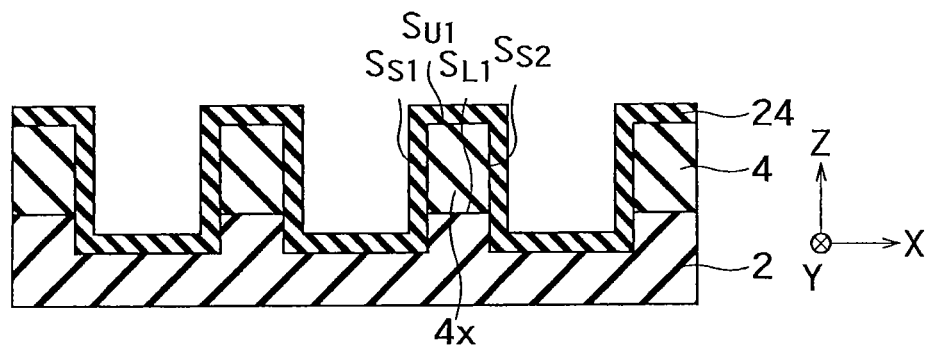
Figure 12B:
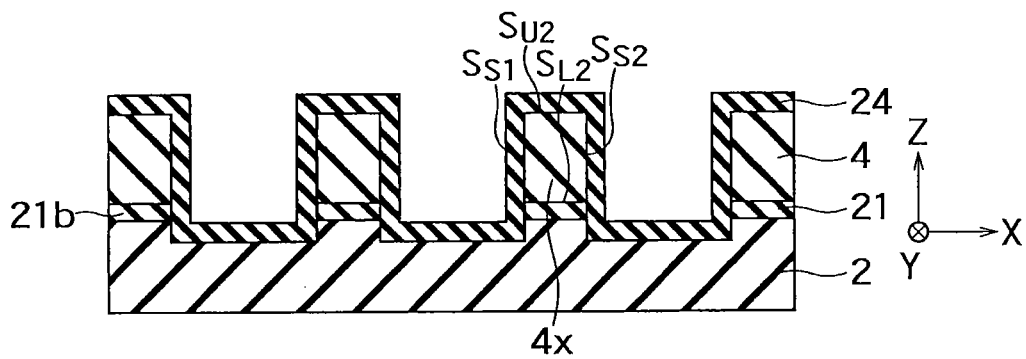
Figure 12C:
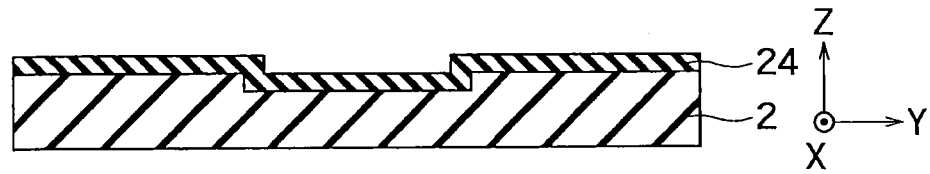
Figure 12D:
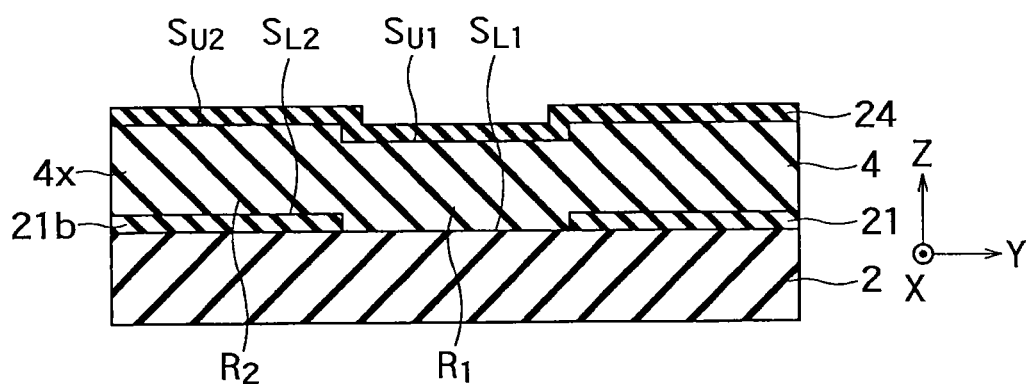

Next, the insulating material 4' and the first sacrificial layer 21 are etched using the resist film 23 as a mask (FIGS. 10A to 10D). As a result, the insulating material 4' is processed into the second insulators 4 having the first lower faces $S_{L1}$ which are in contact with the upper face of the first insulator 2 and the second lower faces $S_{L2}$ which are in contact with the upper face of the first sacrificial layer 21. FIG. 10D illustrates the second insulator 4x alternately having the first regions $R_1$ and the second regions $R_2$. Sign 21b designates patterns of the first sacrificial layer 21 formed in this process. These patterns 21b have the same planar shapes as those of the second regions $R_2$. In this process, the first insulator 2 is also partially etched.

FIG. 10D illustrates the first upper face $S_{U1}$ of the first region $R_1$ and the second upper face $S_{U2}$ of the second region $R_2$. In the present embodiment, the first regions $R_1$ are directly formed on the first insulator 2 and the second regions $R_2$ are formed on the first insulator 2 via the first sacrificial layer 21. As a result, the height of the second upper face $S_{U2}$ is higher than the height of the first upper face $S_{U1}$.

Next, the resist film 23 is removed (FIGS. 11A to 11D).

Next, a second sacrificial layer 24 is formed on the whole surface of the substrate 1 (FIGS. 12A to 12D). As a result, the second sacrificial layer 24 is formed on the first insulator 2, the first sacrificial layer 21, and the upper faces and the side faces of the second insulators 4. The second sacrificial layer 24 is an example of a second film. The second sacrificial layer 24 is, for example, an amorphous silicon layer.

Figure 13A:
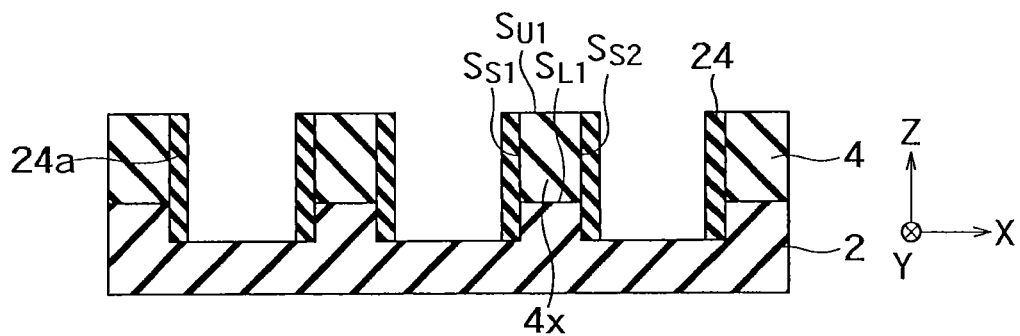
Figure 13B:
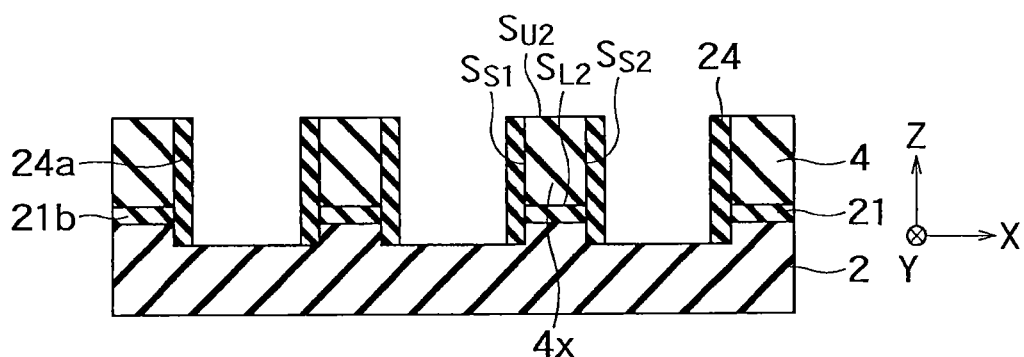
Figure 13C:
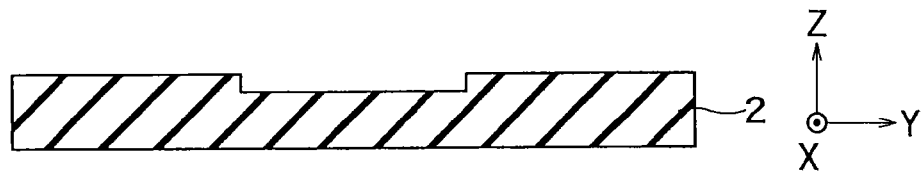
Figure 13D:
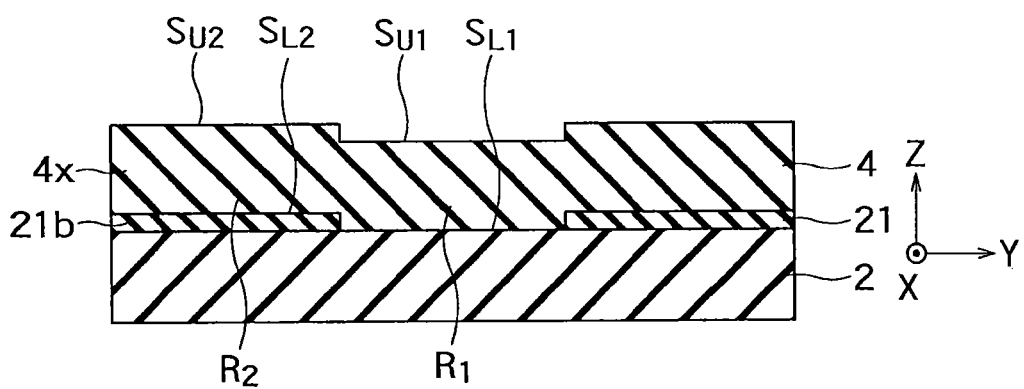
Figure 14A:
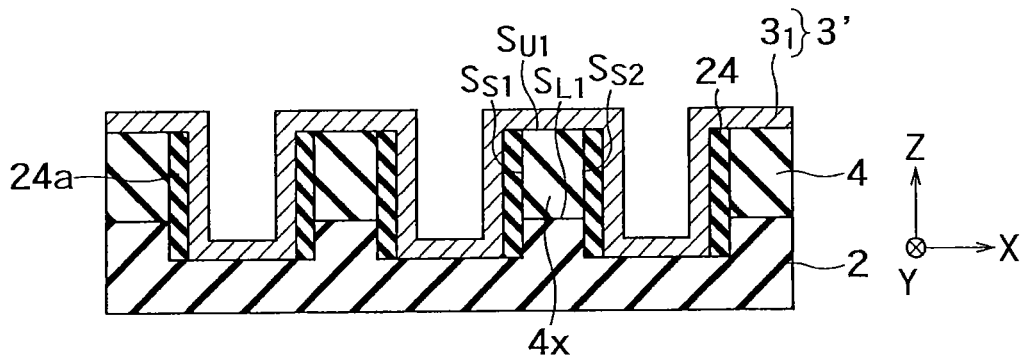
Figure 14B:
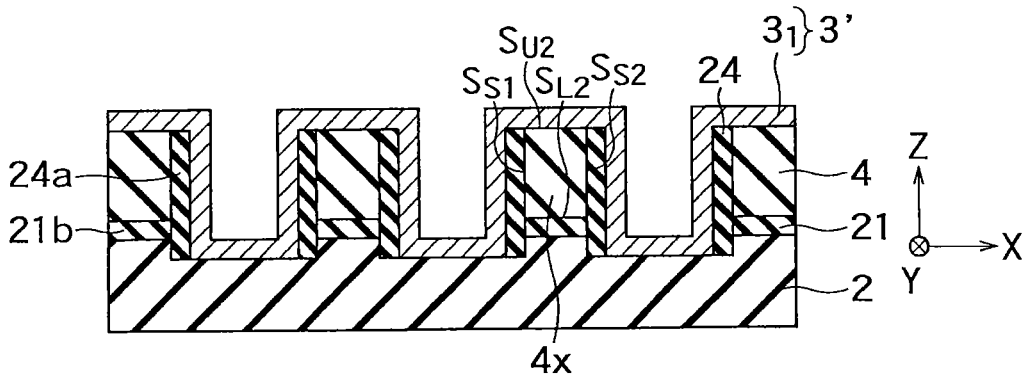
Figure 14C:
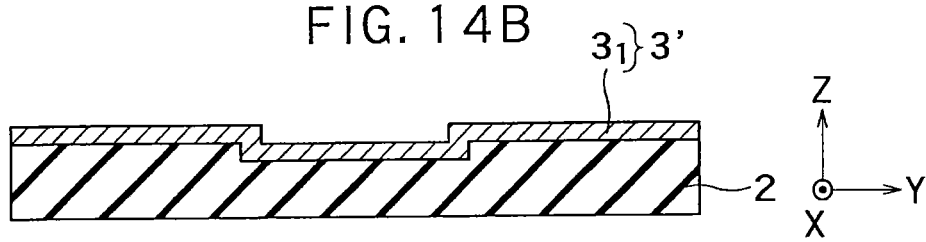
Figure 14D:
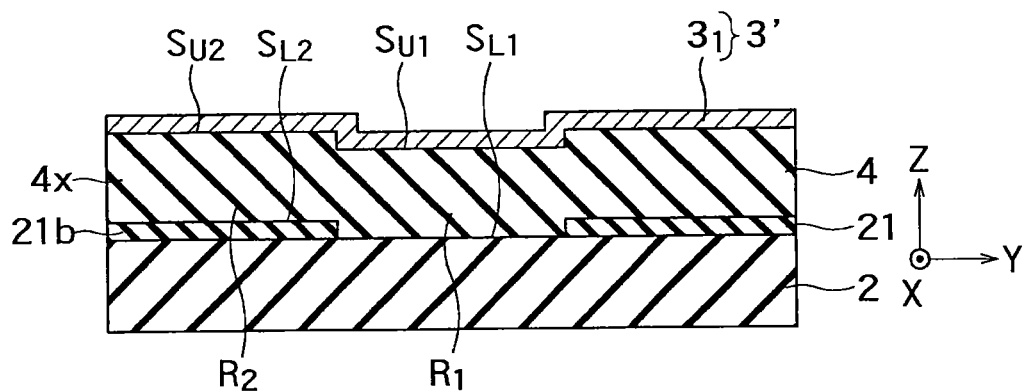
Figure 15A:
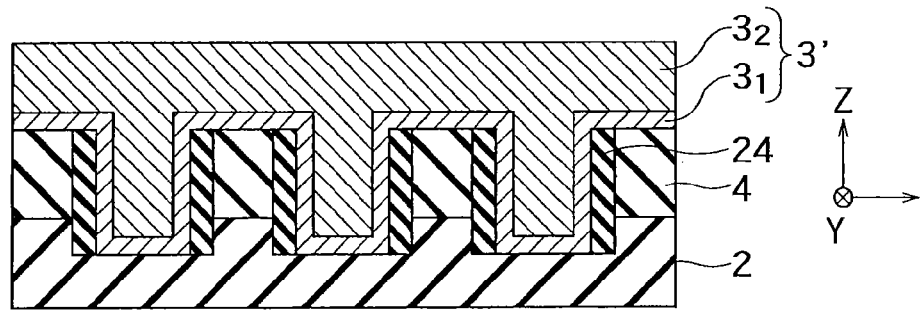
Figure 15B:
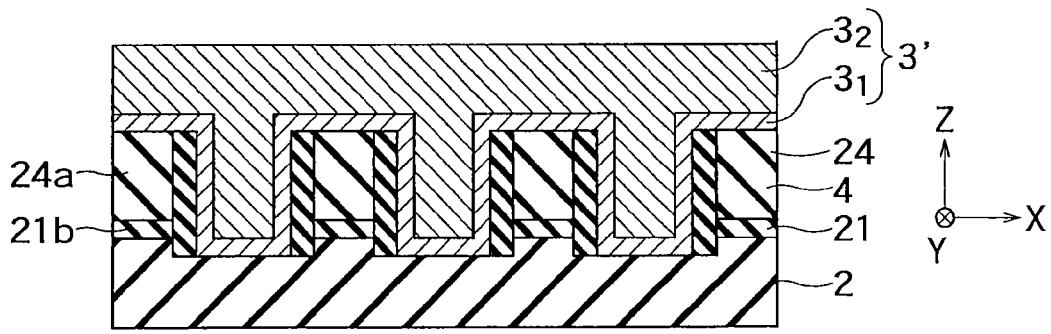
Figure 15C:
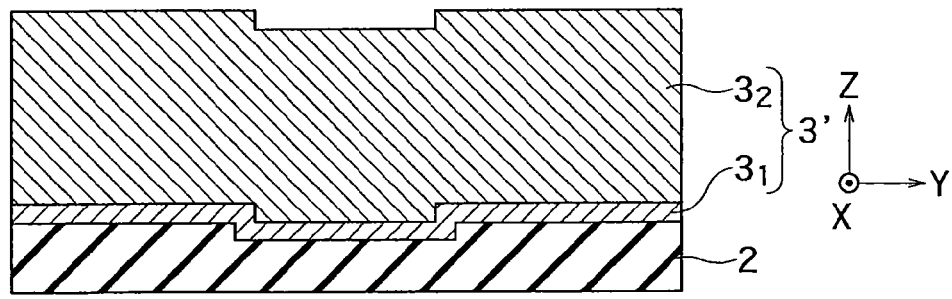
Figure 15D:
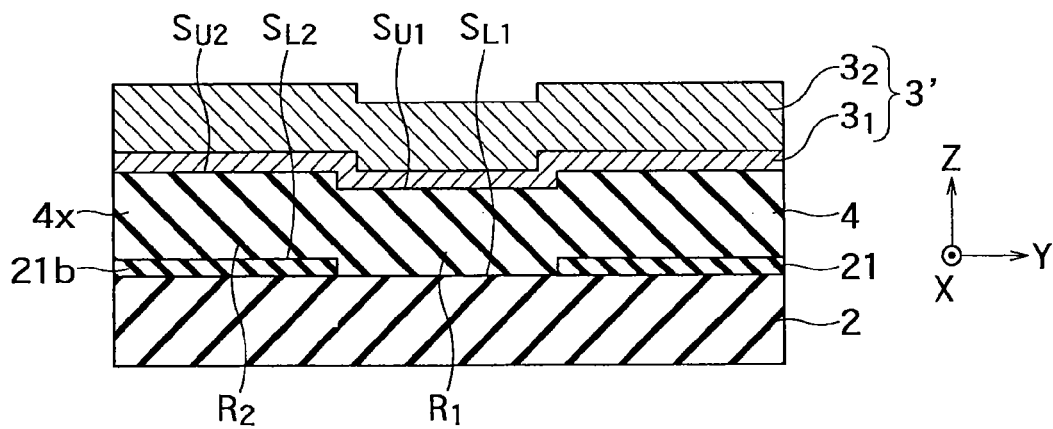
Figure 16A:
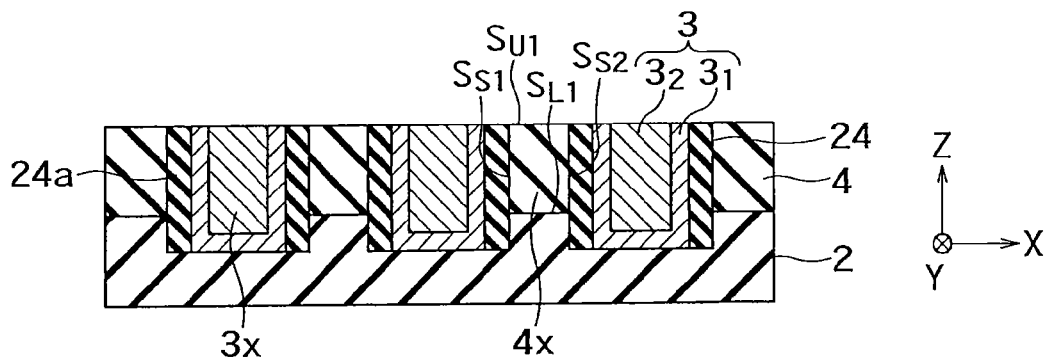
Figure 16B:
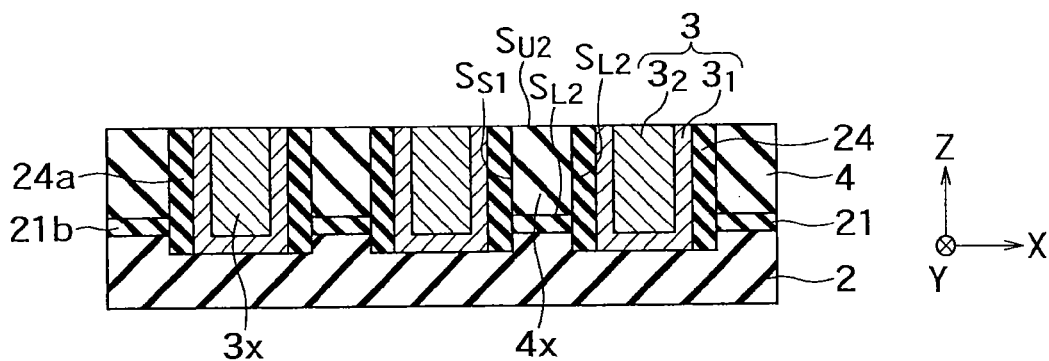
Figure 16C:
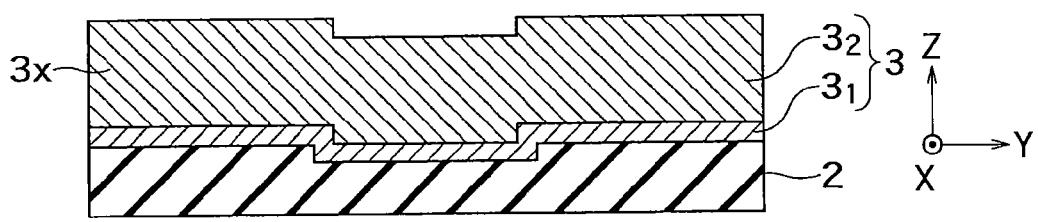
Figure 16D:
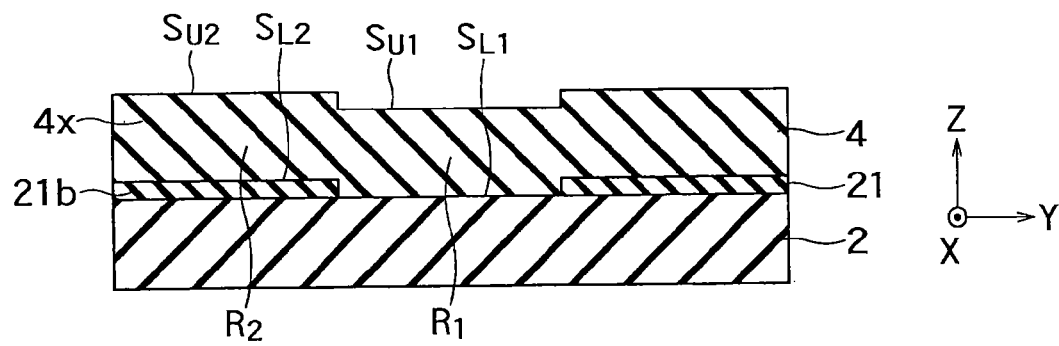
Figure 17A:
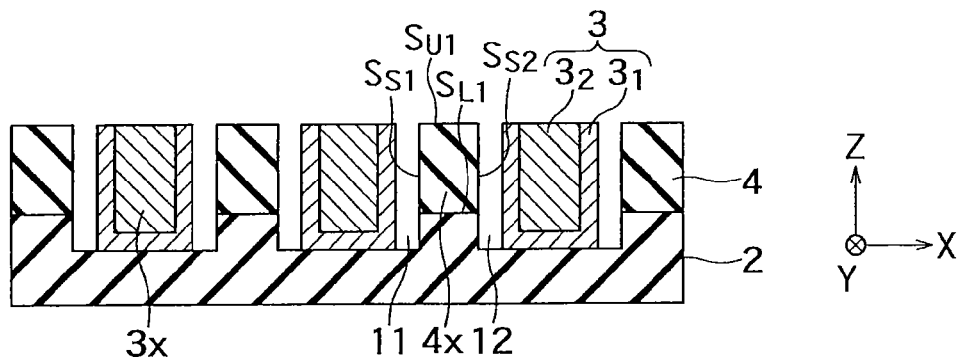
Figure 17B:
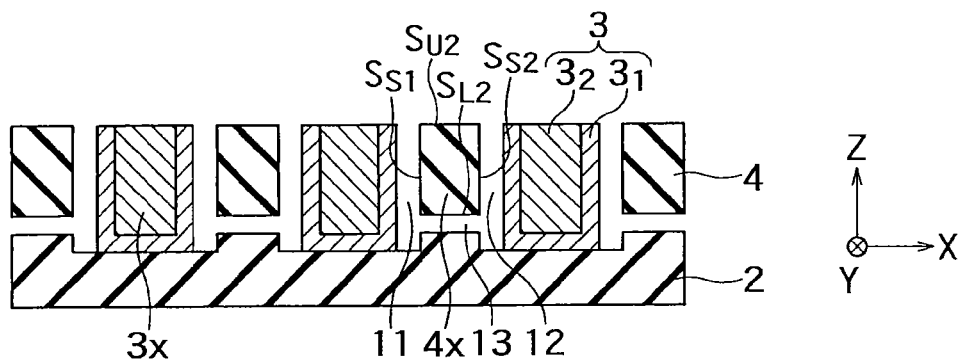
Figure 17C:
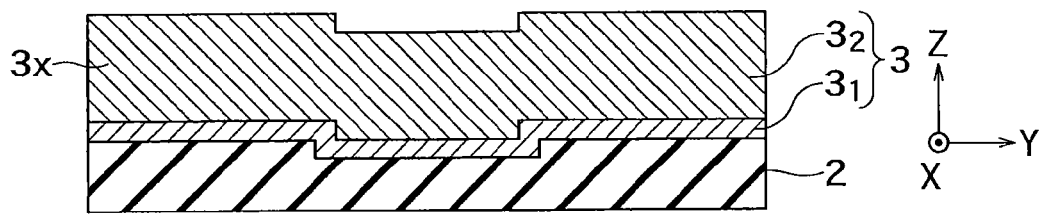
Figure 17D:
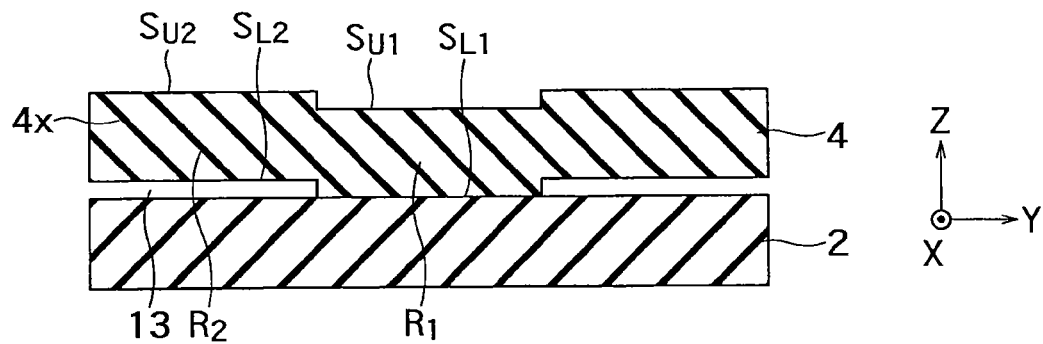
Figure 18A:
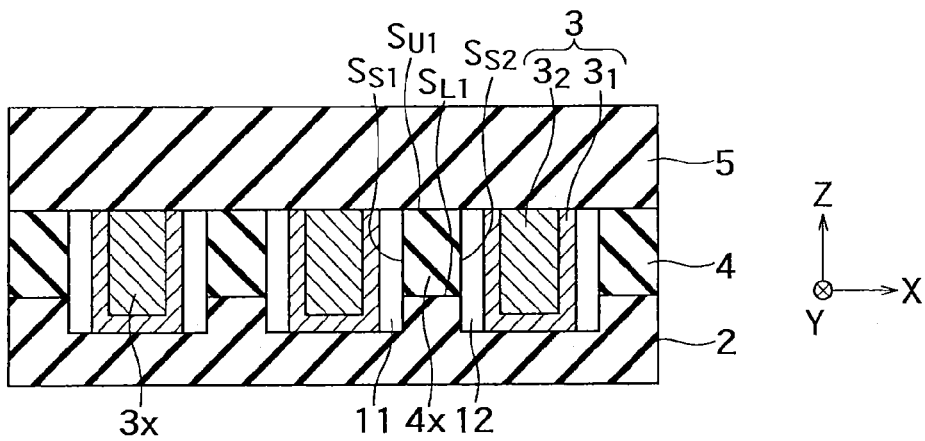
Figure 18B:
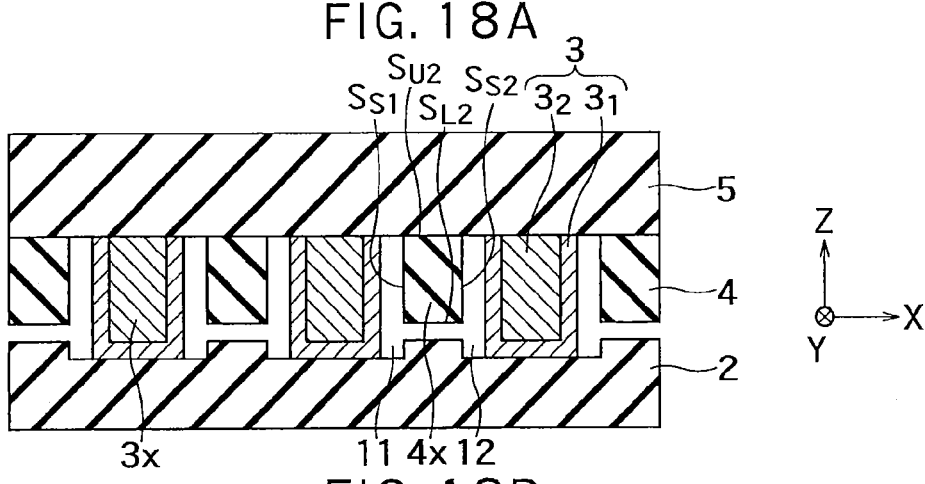
Figure 18C:
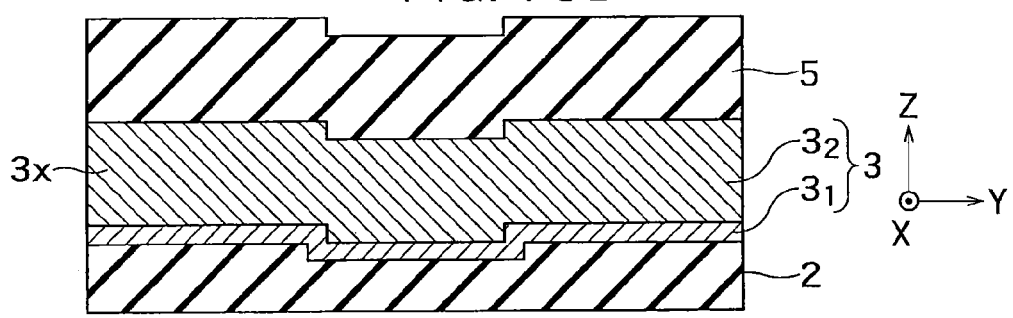
Figure 18D:
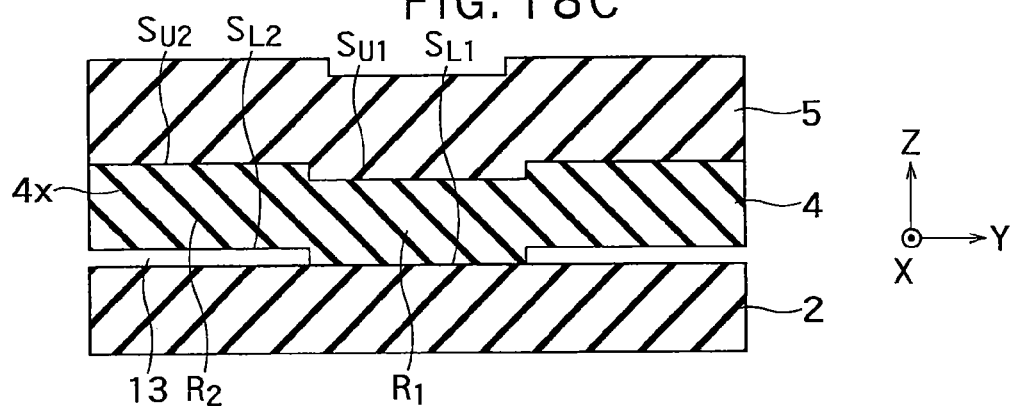

Next, the second sacrificial layer 24 is etched by reactive ion etching (RIE) (FIGS. 13A to 13D). As a result, the second sacrificial layer 24 is removed from the upper faces of the first and second insulators 2 and 4. The second sacrificial layer 24 remains on the side faces of the first insulator 2, the first sacrificial layer 21 and the second insulators 4. Sign 24a designates patterns of the second sacrificial layer 24 formed in this process. FIG. 13A and FIG. 13B illustrate the second insulator 4x in which the first and second side faces $S_{S1}$ and $S_{S2}$ are covered with the second sacrificial layer 24 and the first and second upper faces $S_{U1}$ and $S_{U2}$ are exposed from the second sacrificial layer 24.

Next, the first conductor $3_1$ is formed on the whole surface of the substrate 1 (FIGS. 14A to 14D). Next, the second conductor $3_2$ is formed on the whole surface of the substrate 1 (FIGS. 15A to 15D). As a result, a conductive material 3' for forming the conductors 3 is formed on the whole surface of the substrate 1.

Next, the surface of the conductive material 3' is etched or polished by etching back or chemical mechanical polishing (FIGS. 16A to 16D). This process is performed until the surfaces of the second insulators 4 are exposed. As a result, the conductors 3 are formed between the second insulators 4 via the second sacrificial layer 24.

Next, the first and second sacrificial layers 21 and 24 are removed by wet etching (FIGS. 17A to 17D). As a result, the first and second air gaps 11 and 12 are formed in the regions from which the first sacrificial layer 21 is removed. The third air gaps 13 are formed in the regions from which the second sacrificial layer 24 is removed. Since the first and second sacrificial layers 21 and 24 of the present embodiment are in contact with each other, the third air gaps 13 are formed so as to be connected to the first and second air gaps 11 and 12.

Next, the third insulator 5 is formed on the whole surface of the substrate 1 (FIGS. 18A to 18D). As a result, the third insulator 5 is formed on the conductors 3 and the second insulators 4.

After that, various inter layer dielectrics, interconnect layers and via plug layers and the like are formed on the substrate 1. In this way, the semiconductor device of the present embodiment is manufactured.

As described above, in the present embodiment, not only the first and second air gaps 11 and 12 are formed between the conductors 3 and the second insulators 4, but also the third air gaps 13 are formed between the first insulator 2 and the second insulators 4. Therefore, according to the present embodiment, as compared with the case where only the first and second air gaps 11 and 12 are formed between the conductors 3, the volume of the air gaps between the conductors 3 can be increased. Therefore, according to the present embodiment, the capacitance between the conductors 3 can be further largely reduced, which enables operation speed of the semiconductor device to be improved and power consumption of the semiconductor device to be reduced.

The first and second sacrificial layers 21 and 24 of the present embodiment may be layers other than the amorphous silicon layer as long as the first and second sacrificial layers 21 and 24 can be removed with the conductors 3 allowed to remain.

Second Embodiment (1) Structure of Semiconductor Device of Second Embodiment

Figure 19A:
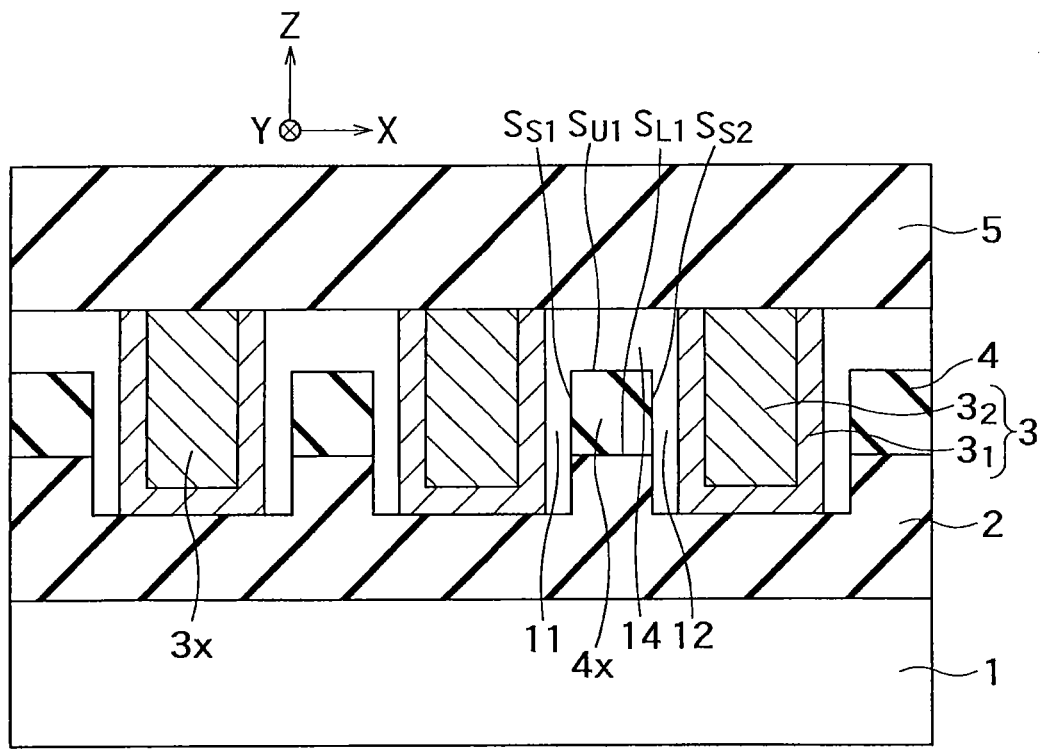
FIGS. 19A and 19B are cross-sectional views illustrating a structure of a semiconductor device of a second embodiment.
Figure 19B:
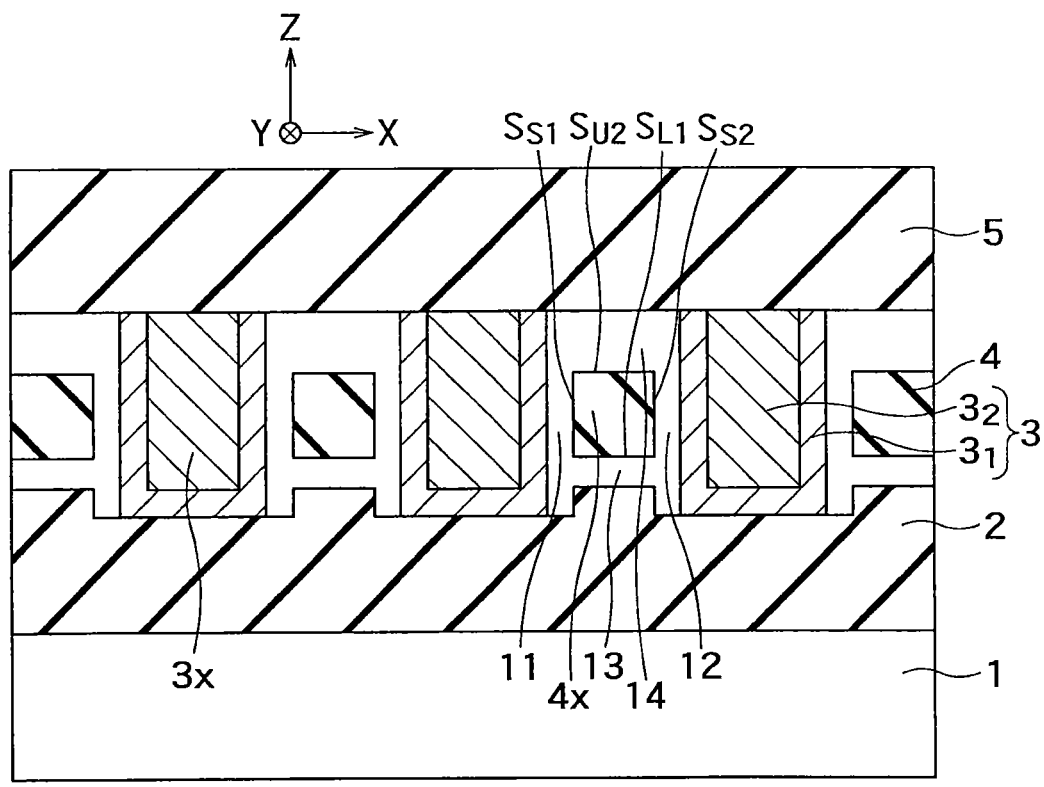

FIGS. 19A and 19B are cross-sectional views illustrating a structure of a semiconductor device of a second embodiment.

FIG. 19A illustrates a cross section taken along the A-A' line in FIG. 1A (cross section of the first regions $R_1$). FIG. 19B illustrates a cross section taken along the B-B' line in FIG. 1A (cross section of the second regions $R_2$).

The first and second upper faces $S_{U1}$ and $S_{U2}$ of the second insulator 4x of the present embodiment are formed below the third insulator 5 via a fourth air gap 14. The first and second upper faces $S_{U1}$ and $S_{U2}$ of the second insulator 4x are separated from the third insulator 5 by the fourth air gap 14. The first and second upper faces $S_{U1}$ and $S_{U2}$ are an example of one or more upper faces. Similarly to the third air gap 13, the fourth air gap 14 is connected to the first and second air gaps 11 and 12.

Figure 20:
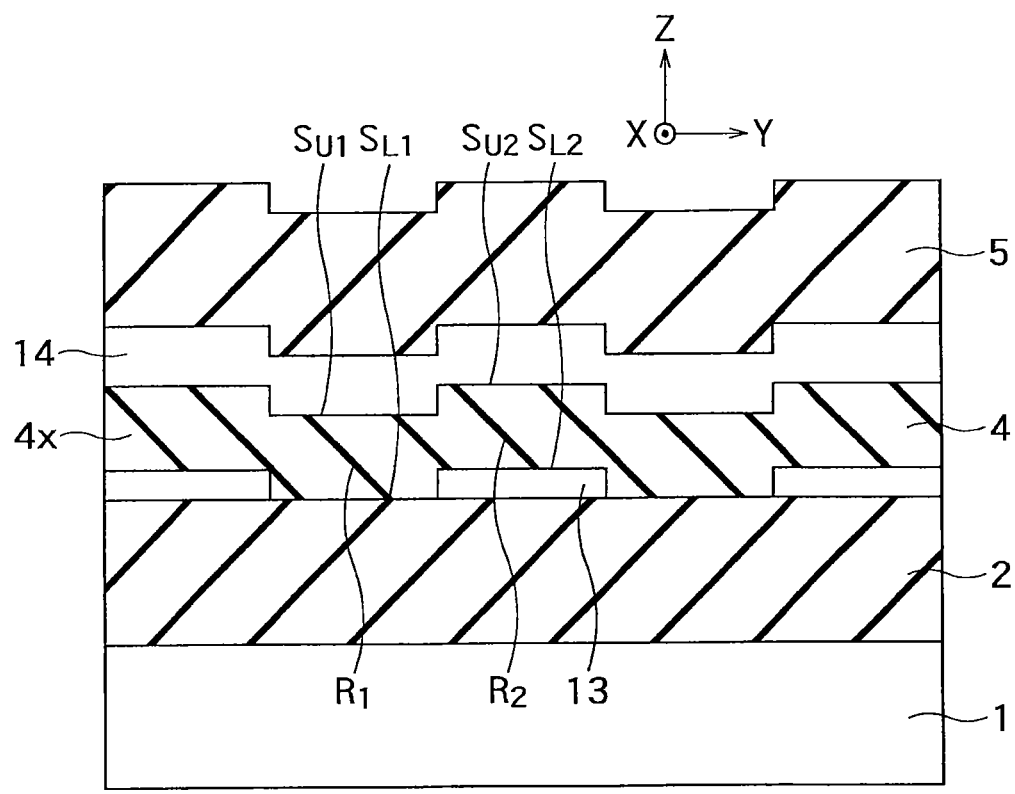
FIG. 20 is a cross-sectional view illustrating the structure of the semiconductor device of the second embodiment.

FIG. 20 is a cross-sectional view illustrating the structure of the semiconductor device of the second embodiment.

FIG. 20 illustrates a cross section taken along the D-D' line in FIG. 1A (cross section of the second insulator 4x). FIG. 20 illustrates the fourth air gap 14 continuously formed on the first and second regions $R_1$ and $R_2$ of the second insulator 4x.

(2) Method of Manufacturing Semiconductor Device of Second Embodiment

FIGS. 21A to 22D are cross-sectional views illustrating a method of manufacturing the semiconductor device of the second embodiment.

FIGS. 21A to 21D illustrate cross sections of the same portions as those of FIGS. 4A to 4D, respectively. The same holds true for FIGS. 22A to 22D.

First, the process in FIGS. 4A to 4D to the process in FIGS. 17A to 17D are performed.

Figure 21A:
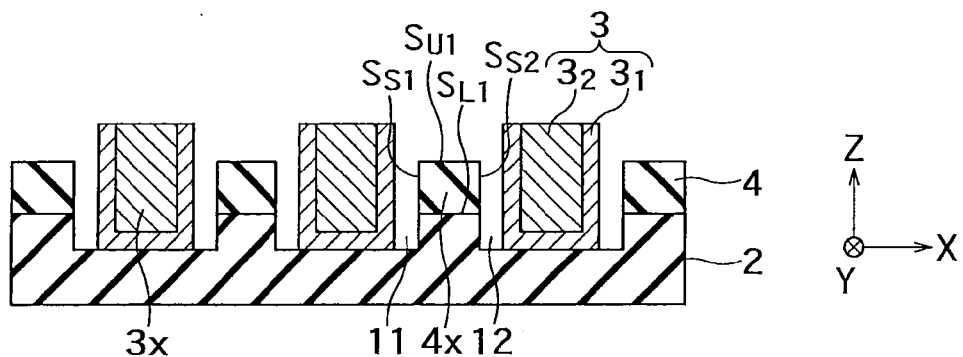
FIGS. 21A to 22D are cross-sectional views illustrating a method of manufacturing the semiconductor device of the second embodiment.
Figure 21B:
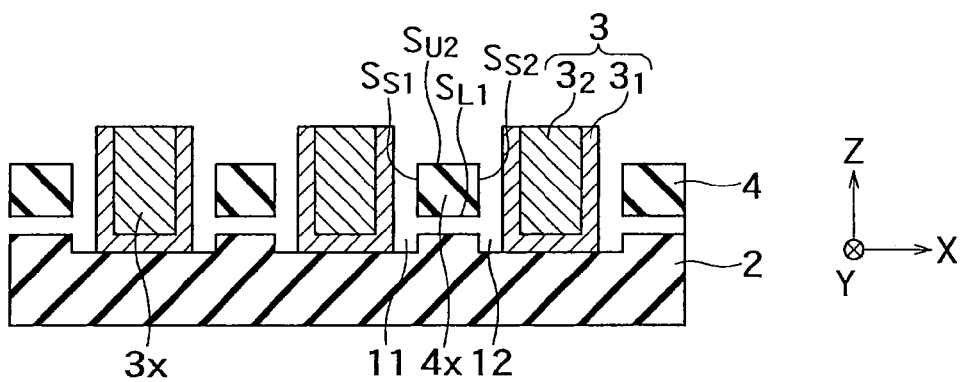
Figure 21C:
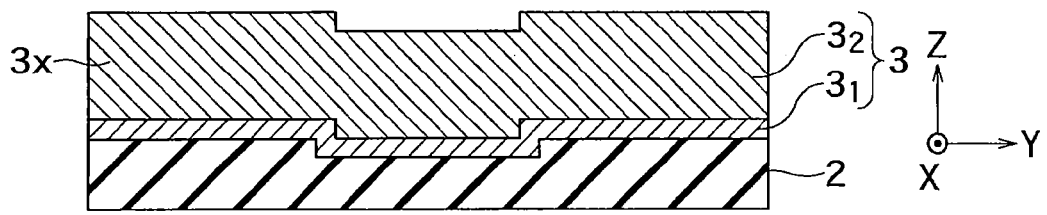
Figure 21D:
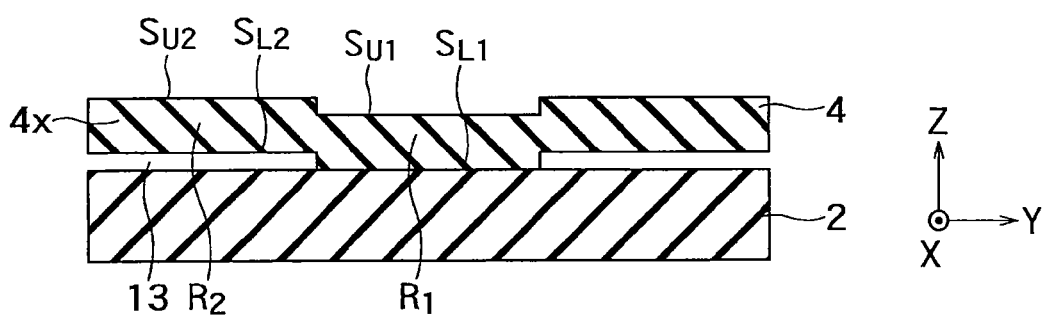
Figure 22A:
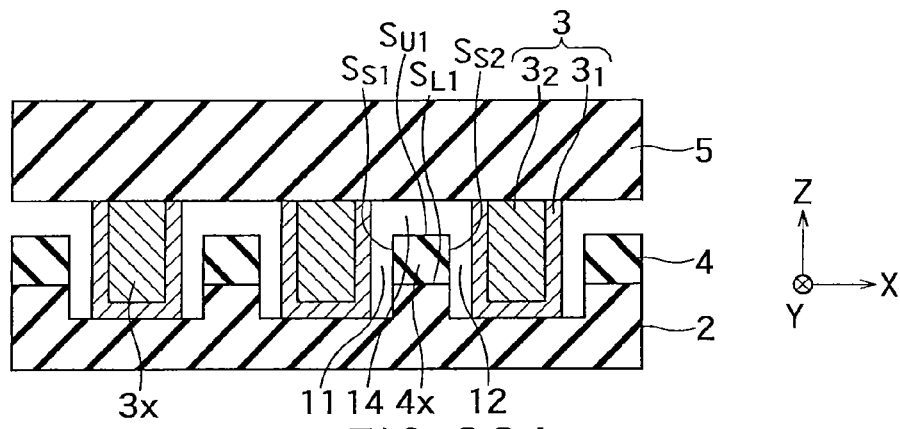
Figure 22B:
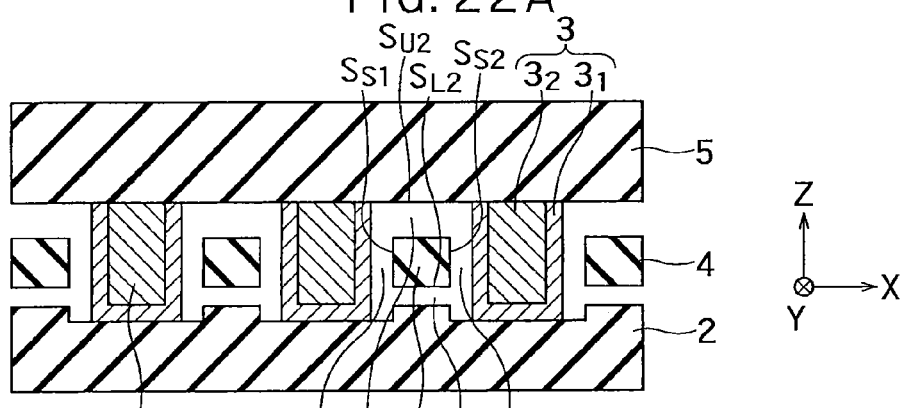
Figure 22C:
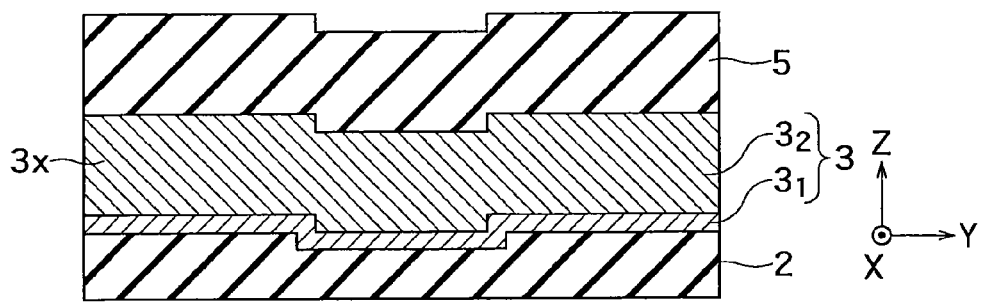
Figure 22D:
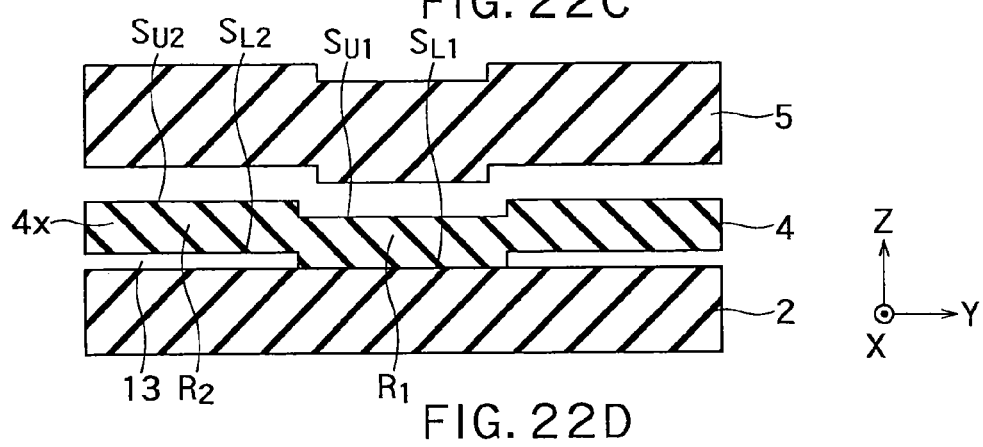

Next, the upper faces of the second insulators 4 are etched by dry etching (FIGS. 21A to 21D). FIG. 21A and FIG. 21B illustrate the first and second upper faces $S_{U1}$ and $S_{U2}$ of the second insulator 4x which are lower than the upper faces of the conductors 3.

Next, the third insulator 5 is formed on the whole surface of the substrate 1 (FIGS. 22A to 22D). As a result, the third insulator 5 is formed on the conductors 3. The third insulator 5 of the present embodiment is formed above the second insulators 4 via the fourth air gaps 14. FIGS. 22A to 22D illustrate the fourth air gaps 14 formed between the first and second upper faces $S_{U1}$ and $S_{U2}$ of the second insulator 4x and the third insulator 5.

After that, various inter layer dielectrics, interconnect layers and via plug layers and the like are formed on the substrate 1. In this way, the semiconductor device of the present embodiment is manufactured.

As described above, in the present embodiment, not only the third air gaps 13 are formed between the first insulator 2 and the second insulators 4, but also the fourth air gaps 14 are formed between the second insulators 4 and the third insulator 5. Therefore, according to the present embodiment, as compared with the case where only the first to third air gaps 11 to 13 are formed between the conductors 3, the volume of the air gaps between the conductors 3 can be increased. Therefore, according to the present embodiment, the capacitance between the conductors 3 can be largely reduced more than in the case of the first embodiment.

Third Embodiment (1) Structure of Semiconductor Device of Third Embodiment

Figure 23A:
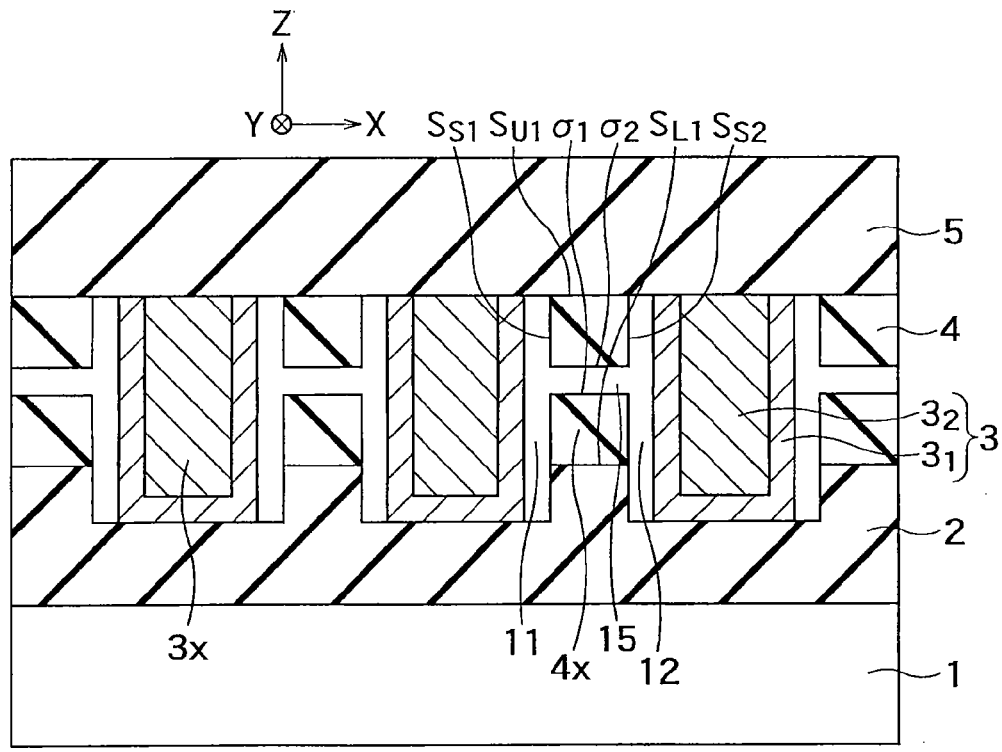
FIGS. 23A and 23B are cross-sectional views illustrating a structure of a semiconductor device of a third embodiment.
Figure 23B:
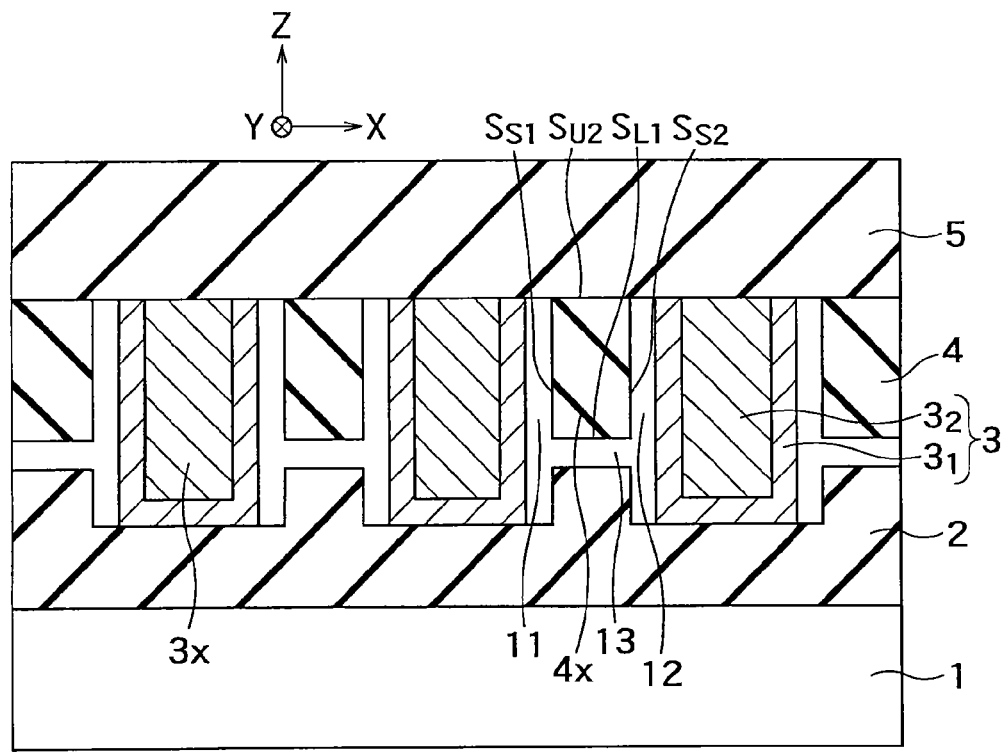

FIGS. 23A and 23B are cross-sectional views illustrating a structure of a semiconductor device of a third embodiment.

FIG. 23A illustrates a cross section taken along the A-A' line in FIG. 1A (cross section of the first regions $R_1$). FIG. 23B illustrates a cross section taken along the B-B' line in FIG. 1A (cross section of the second regions $R_2$).

Figure 24:
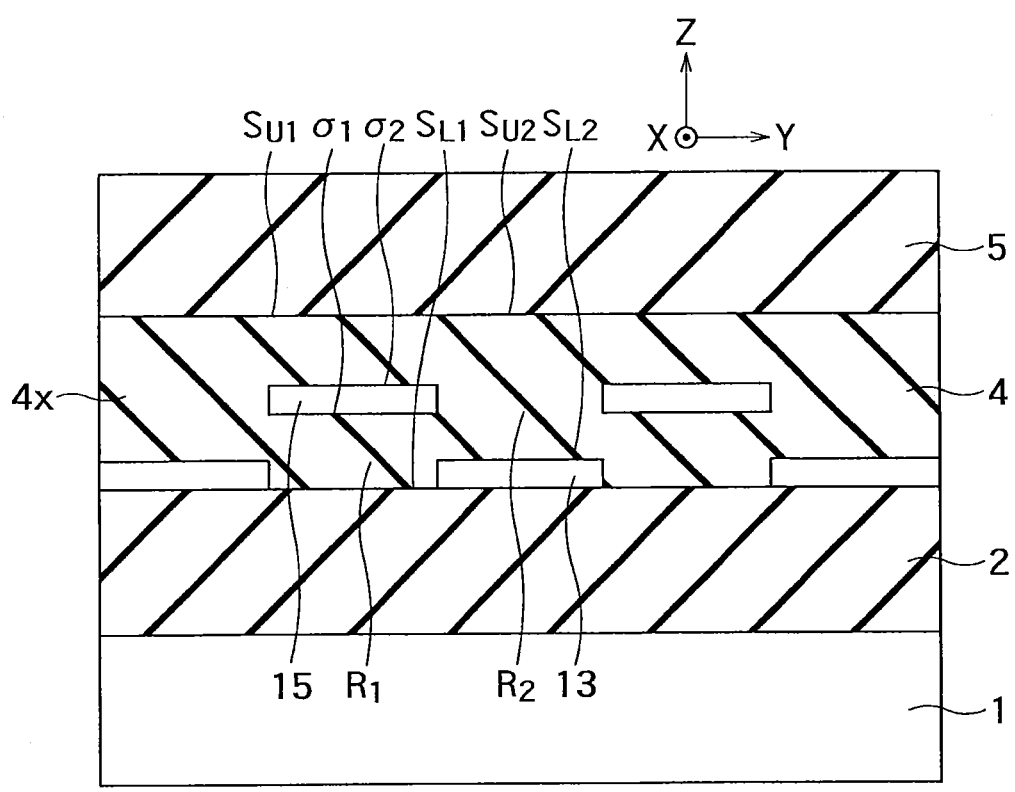
FIG. 24 is a cross-sectional view illustrating the structure of the semiconductor device of the third embodiment.
Figure 25A:
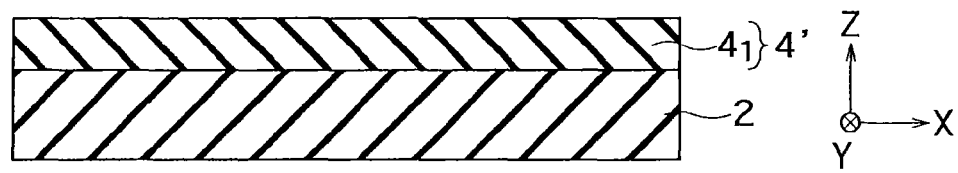
FIGS. 25A to 30D are cross-sectional views illustrating a method of manufacturing the semiconductor device of the third embodiment.
Figure 25B:
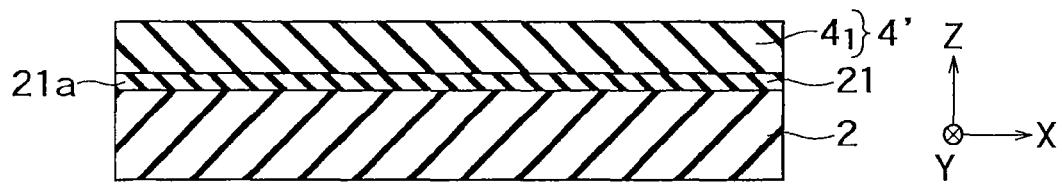
Figure 25C:
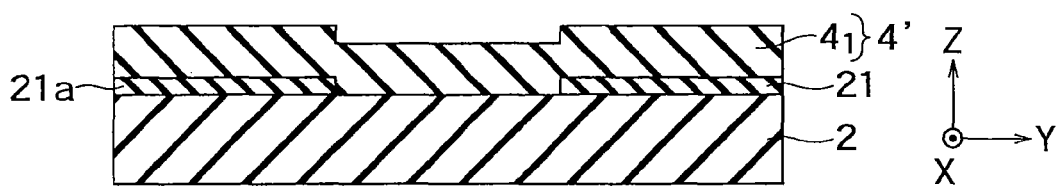
Figure 25D:
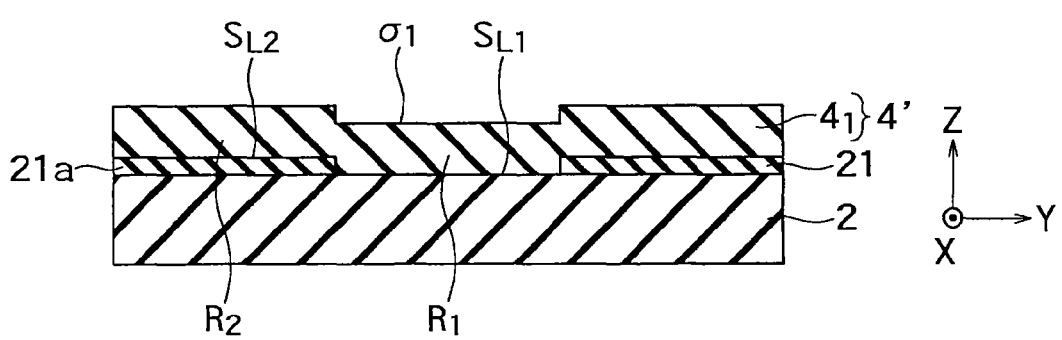
Figure 26A:
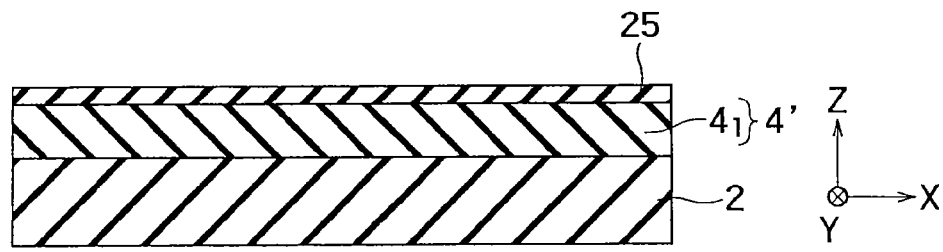
Figure 26B:
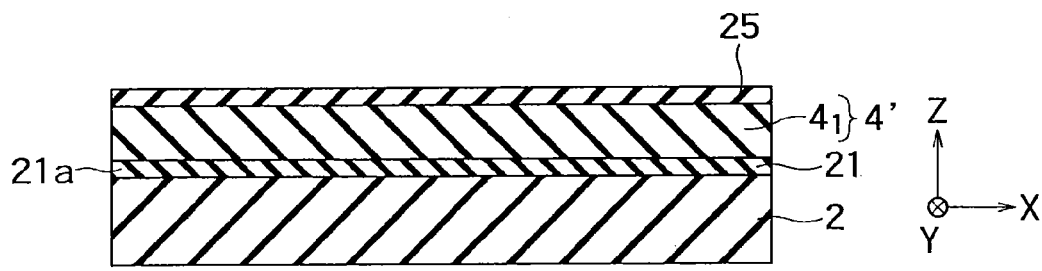
Figure 26C:
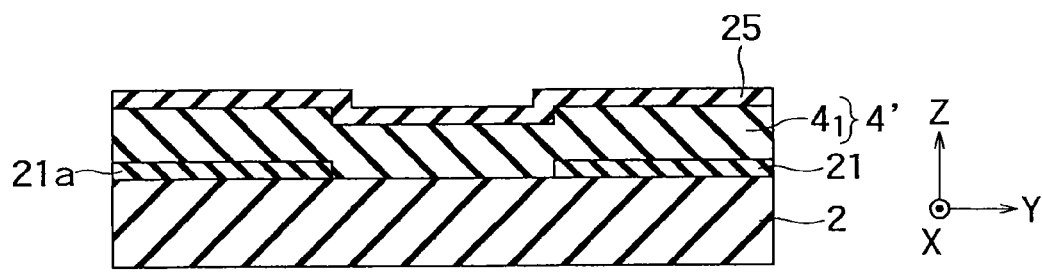
Figure 26D:
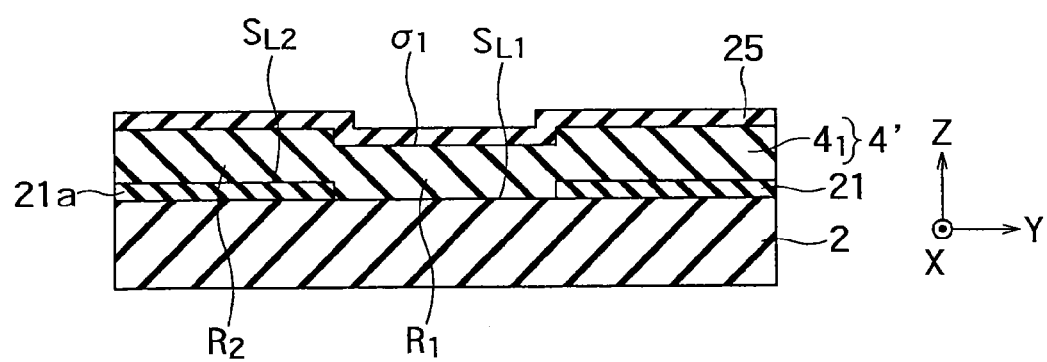
Figure 27A:
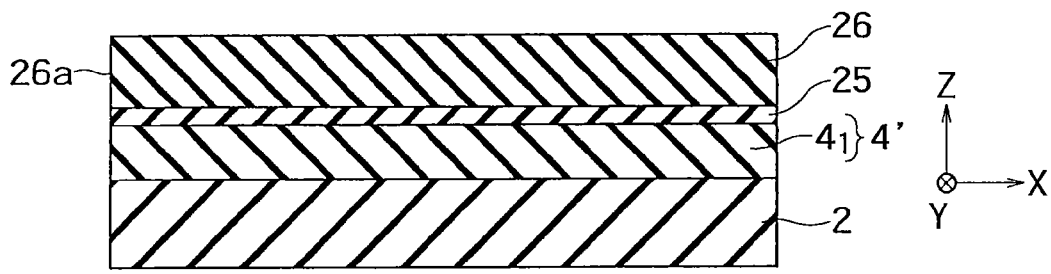
Figure 27B:
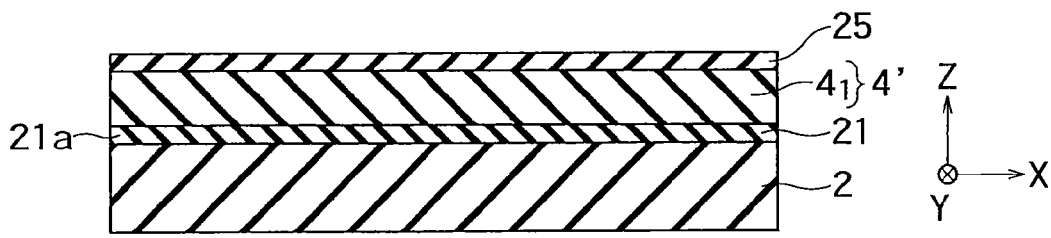
Figure 27C:
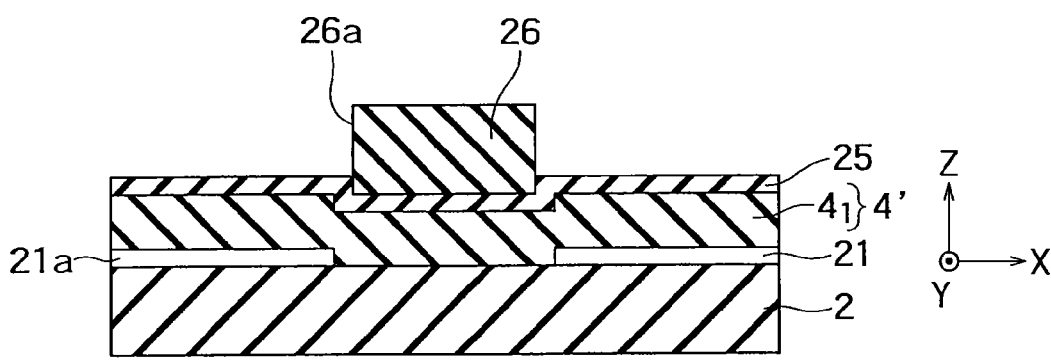
Figure 27D:
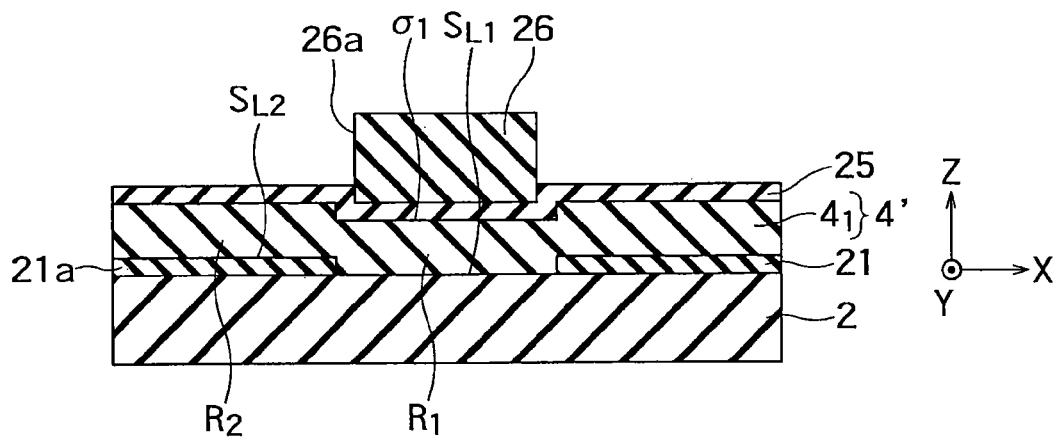
Figure 28A:
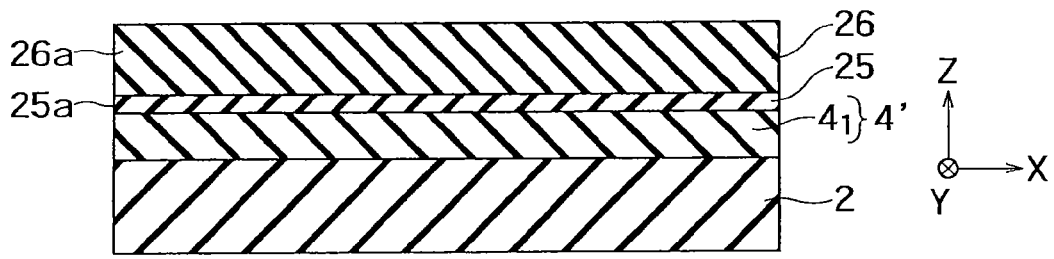
Figure 28B:
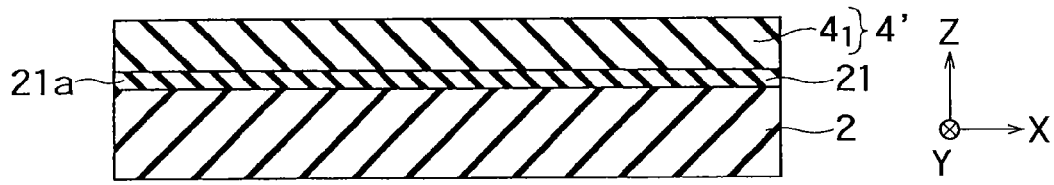
Figure 28C:
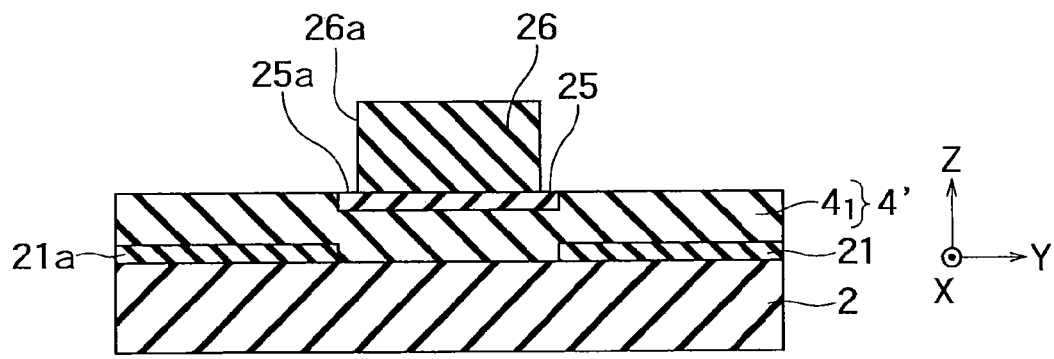
Figure 28D:
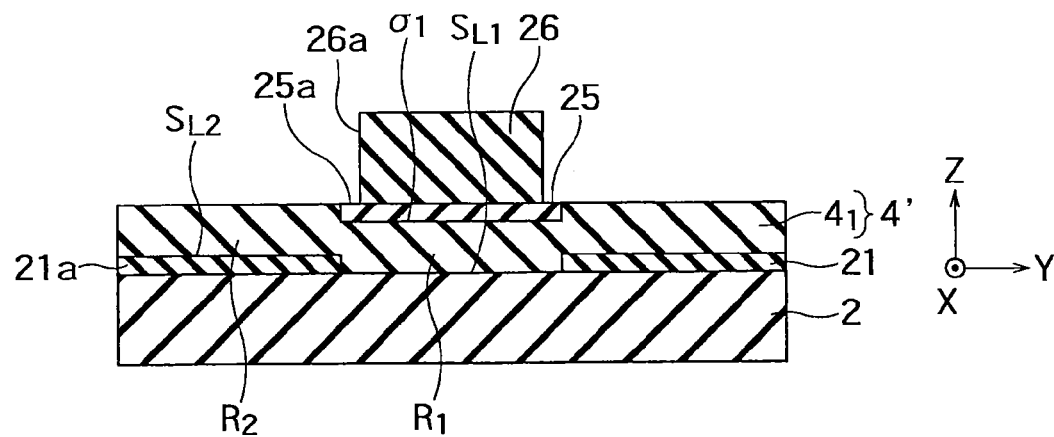
Figure 29A:
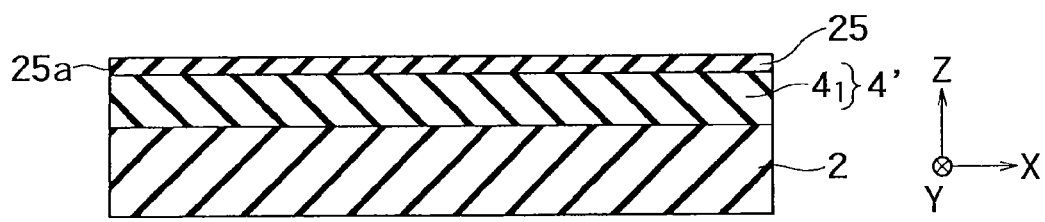
Figure 29B:
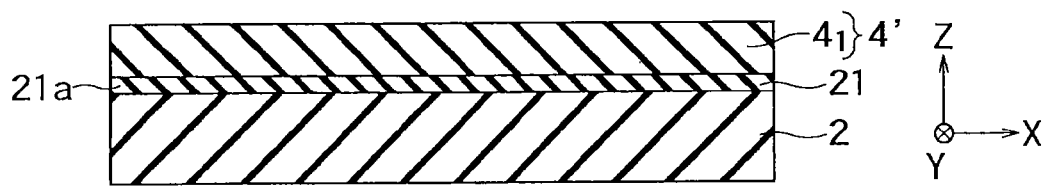
Figure 29C:
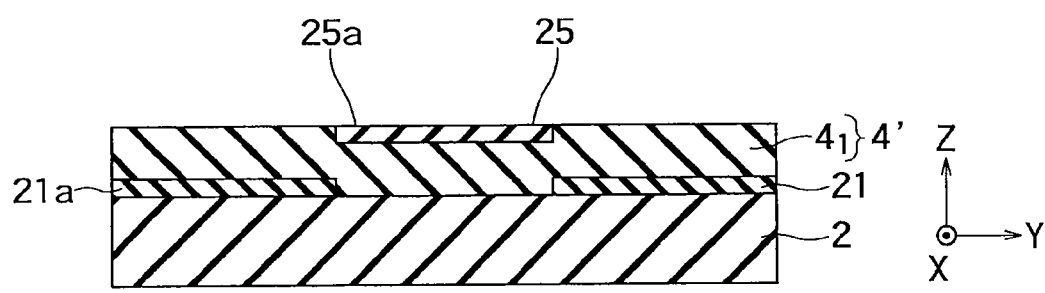
Figure 29D:
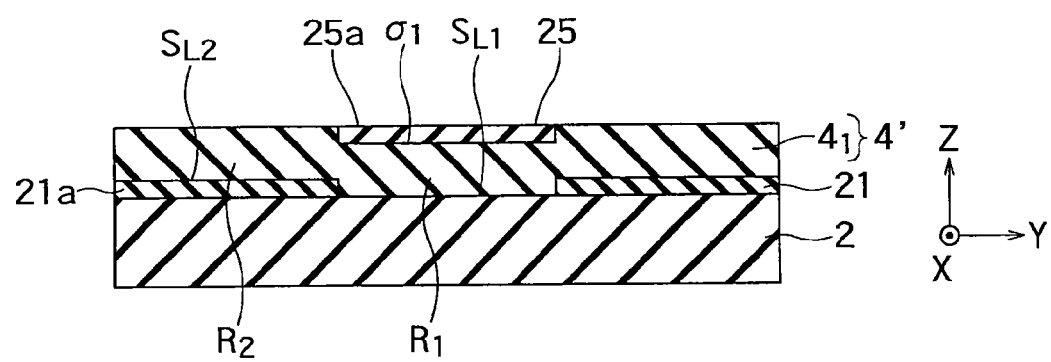

The second insulator $4x$ of the present embodiment has a shape which surrounds fifth air gaps 15 and has first faces $\sigma_1$ which are lower faces of the fifth air gaps 15 and second faces $\sigma_2$ which are upper faces of the fifth air gaps 15 (also refer to FIG. 24). Similarly to the third air gaps 13, the fifth air gaps 15 are connected to the first and second air gaps 11 and 12.

FIG. 24 is a cross-sectional view illustrating the structure of the semiconductor device of the third embodiment.

FIG. 24 illustrates a cross section taken along the D-D' line in FIG. 1A (cross section of the second insulator $4x$). The second insulator $4x$ of the present embodiment alternately has the first regions $R_1$ having the first lower faces $S_{U1}$, the first faces $\sigma_1$ and the second faces $\sigma_2$, and the second regions $R_2$ having the second lower faces $S_{U2}$. In this way, the third air gaps 13 are provided below the second regions $R_2$ and the fifth air gaps 15 are provided in the first regions $R_1$.

(2) Method of Manufacturing Semiconductor Device of Third Embodiment

FIGS. 25A to 30D are cross-sectional views illustrating a method of manufacturing the semiconductor device of the third embodiment.

FIGS. 25A to 25D illustrate cross sections of the same portions as those of FIGS. 4A to 4D, respectively. The same holds true for FIG. 26A to FIG. 30D.

First, the process in FIGS. 4A to 4D to the process in FIGS. 7A to 7D are performed.

Next, a first layer $4_1$ of the insulating material 4' is formed on the first insulator 2 and the first sacrificial layer 21 (FIGS. 25A to 25D).

Next, a third sacrificial layer 25 is formed on the first layer $4_1$ of the insulating material 4' (FIGS. 26A to 26D). The third sacrificial layer 25 is an example of a third film. The third sacrificial layer 25 is, for example, an amorphous silicon layer.

Next, a resist film 26 is formed on the third sacrificial layer 25 and patterning of the resist film 26 is performed by lithography (FIGS. 27A to 27D). Sign 26a designates patterns of the resist film 26 formed in this process. These patterns 26a extend in the X direction and are processed into shapes including the formation scheduled regions of the first regions $R_1$.

Next, the third sacrificial layer 25 is etched using the resist film 26 as a mask (FIGS. 28A to 28D). Sign 25a designates patterns of the third sacrificial layer 25 formed in this process. These patterns 25a extend in the X direction and are processed into shapes including the formation scheduled regions of the first regions $R_1$.

Next, the resist film 26 is removed (FIGS. 29A to 29D).

Next, a second layer $4_2$ of the insulating material 4' is formed on the first layer $4_1$ of the insulating material 4' and the third sacrificial layer 25 (FIGS. 30A to 30D). The first layer $4_1$ and the second layer $4_2$ are separated from each other in the formation scheduled regions of the first regions $R_1$ and are in contact with each other in the formation scheduled regions of the second regions $R_2$.

Figure 8A:
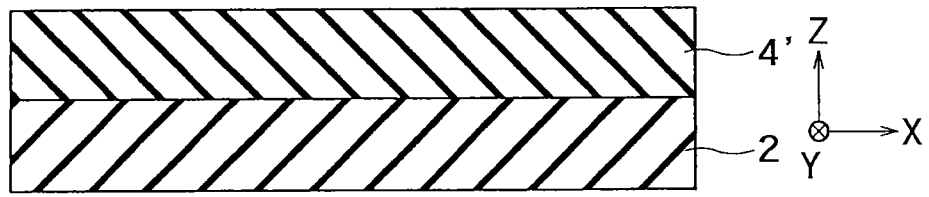
Figure 8B:
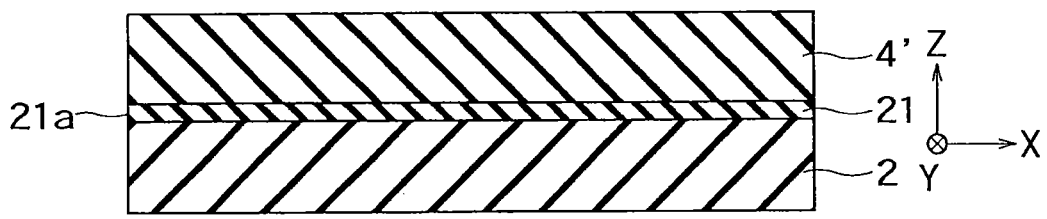
Figure 8C:
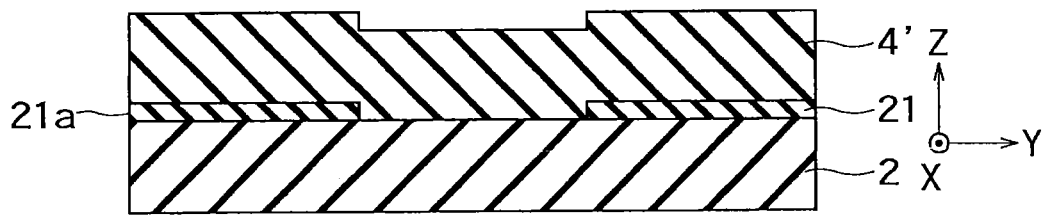
Figure 8D:
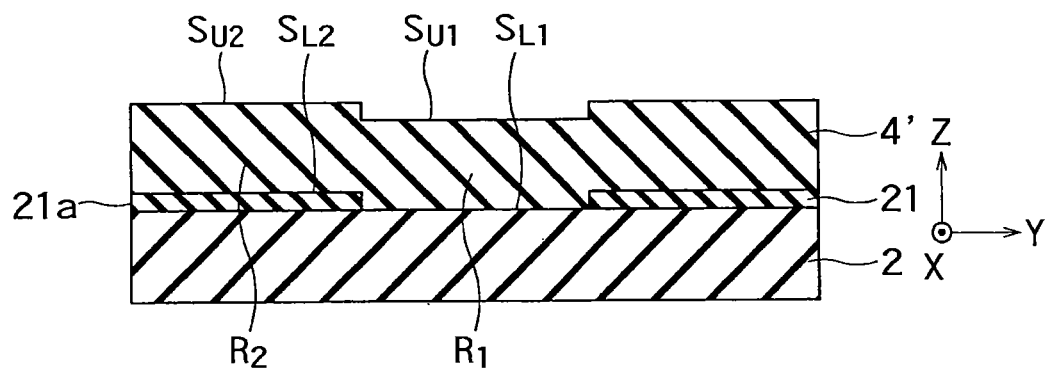
Figure 9A:
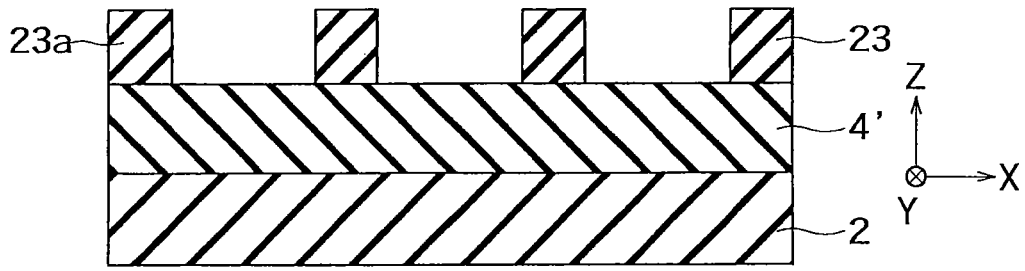
Figure 9B:
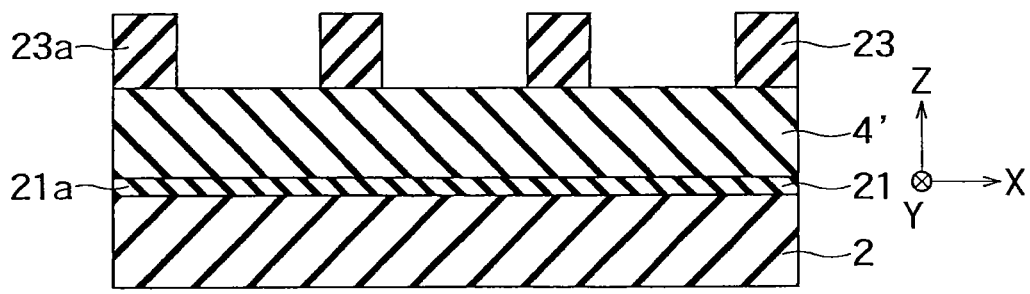
Figure 9C:
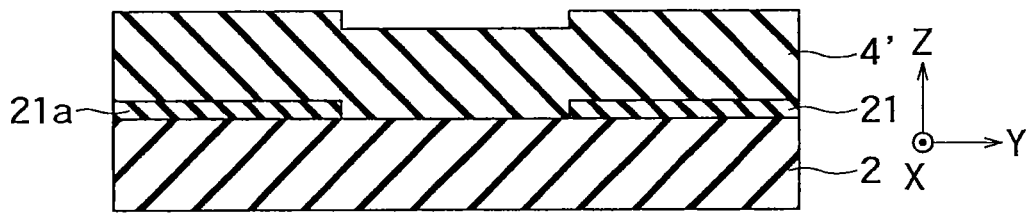
Figure 9D:
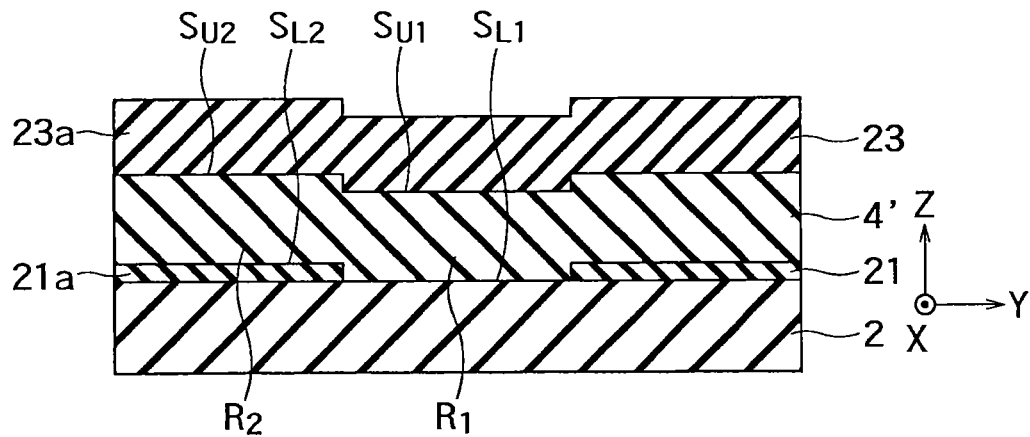
Figure 30A:
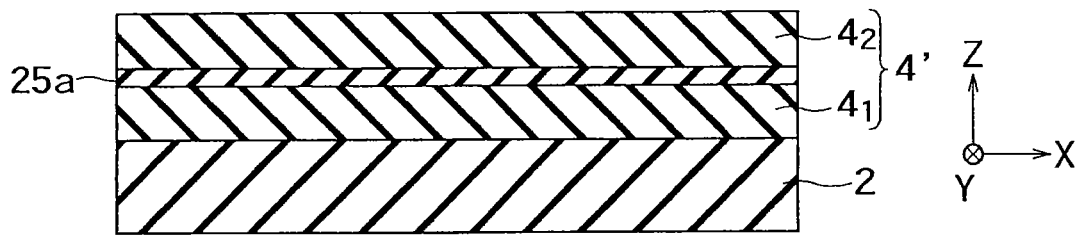
Figure 30B:
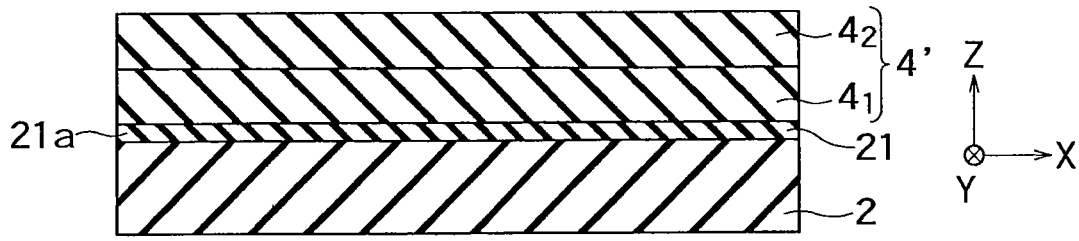
Figure 30C:
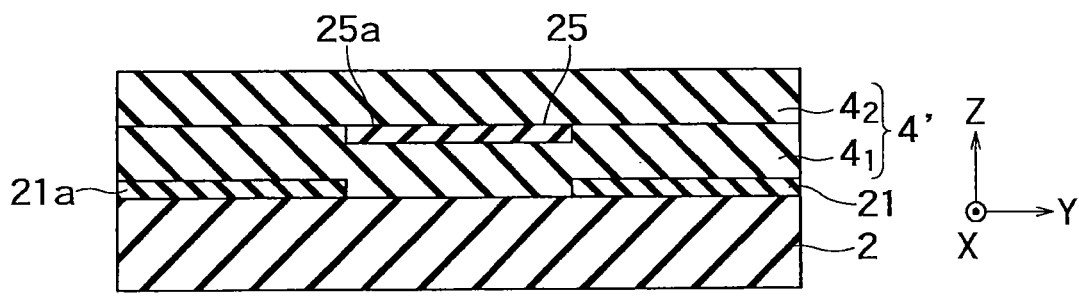
Figure 30D:
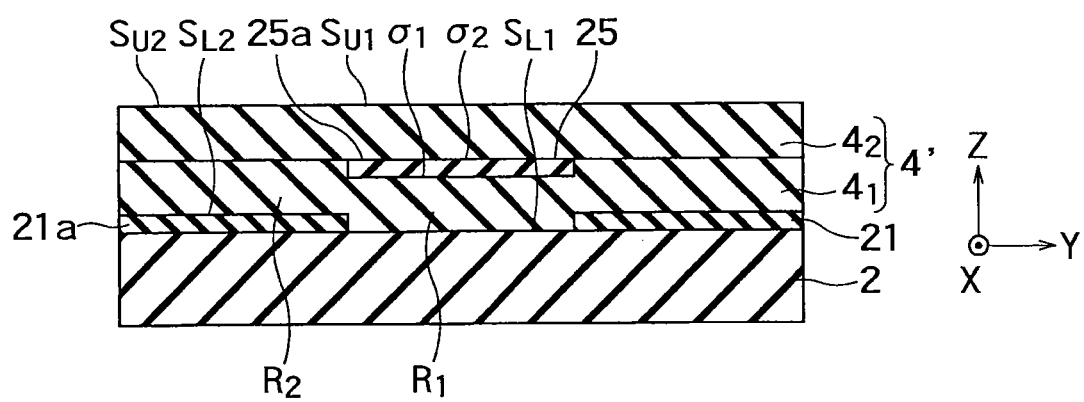
Figure 31A:
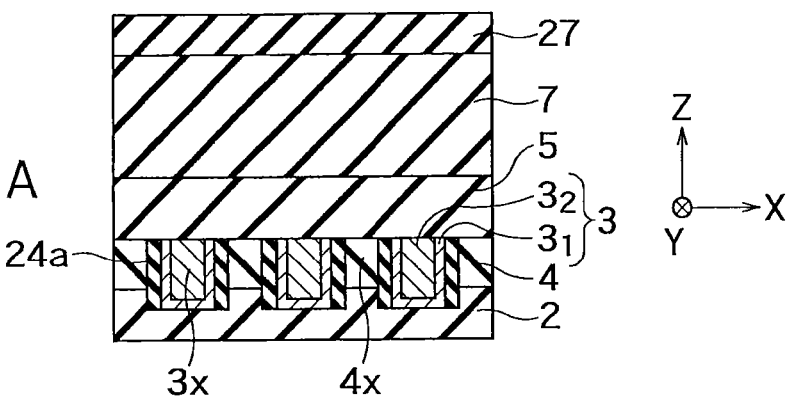
FIGS. 31A to 33D are cross-sectional views illustrating a method of manufacturing a semiconductor device of a fourth embodiment.
Figure 31B:
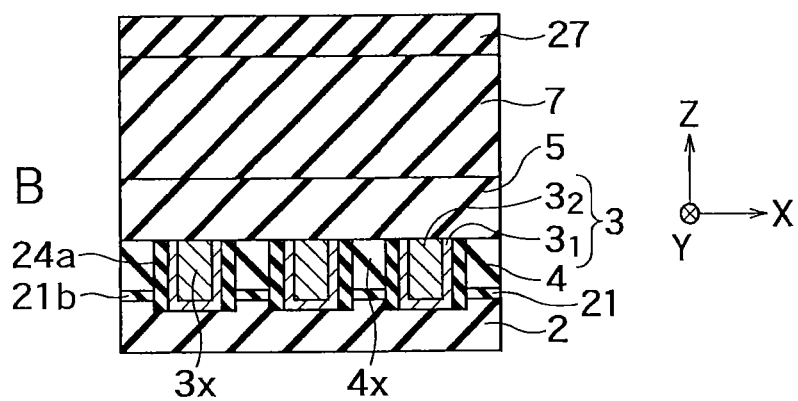
Figure 31C:
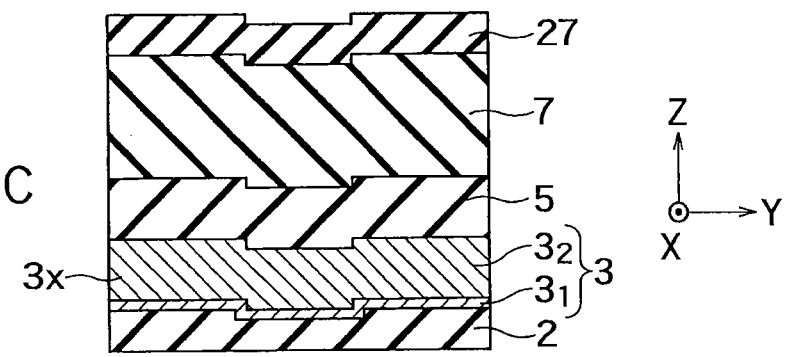
Figure 31D:
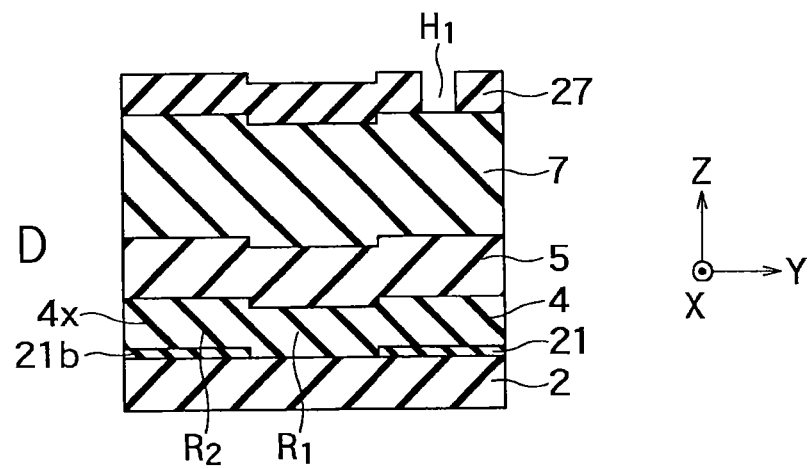
Figure 32A:
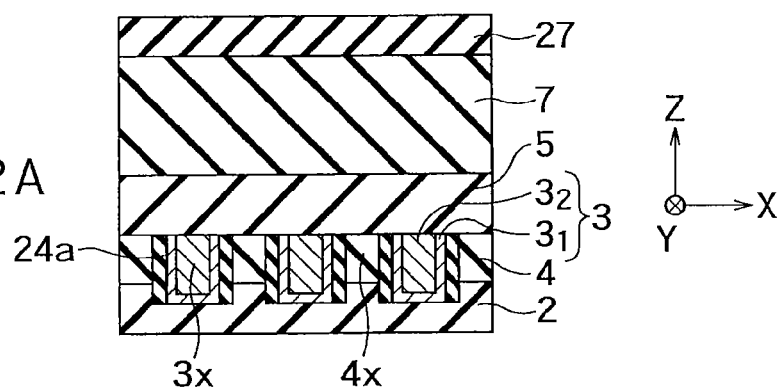
Figure 32B:
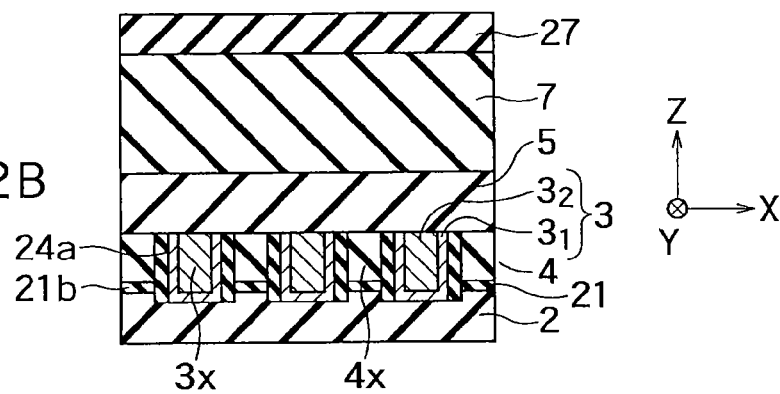
Figure 32C:
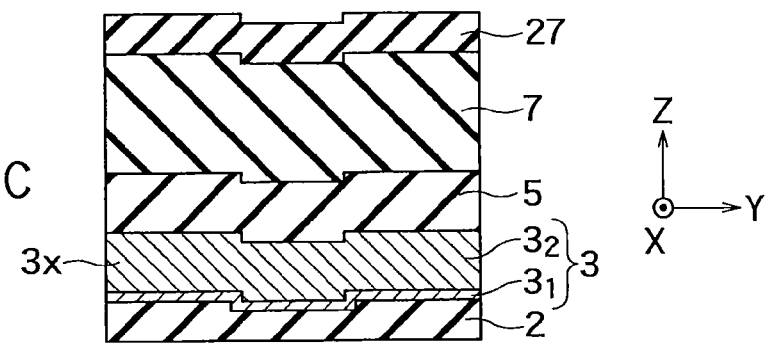
Figure 32D:
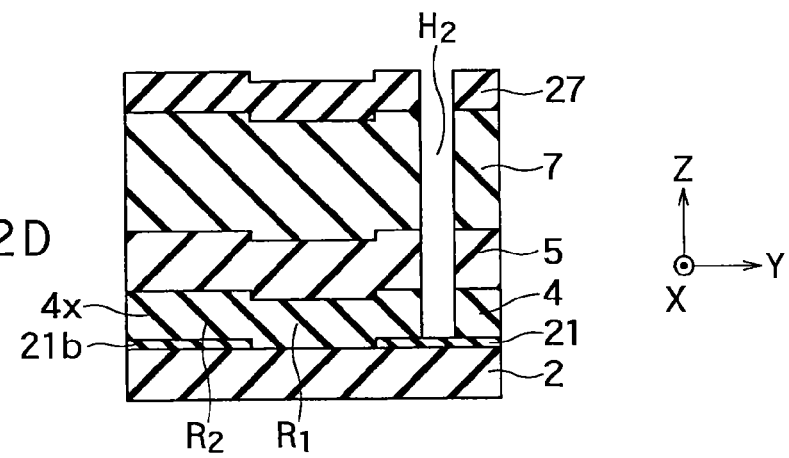
Figure 33A:
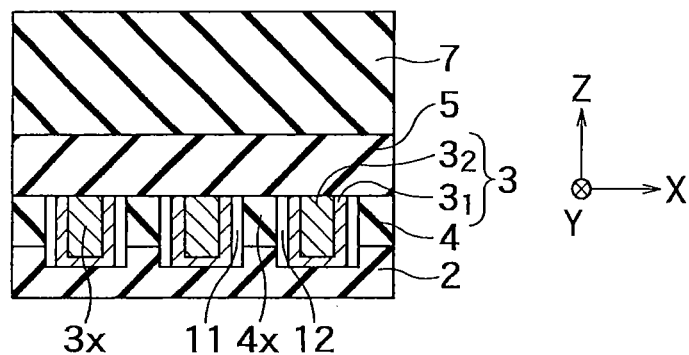
Figure 33B:
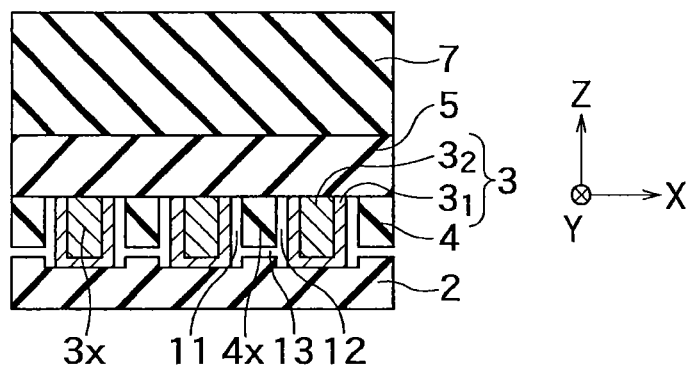
Figure 33C:
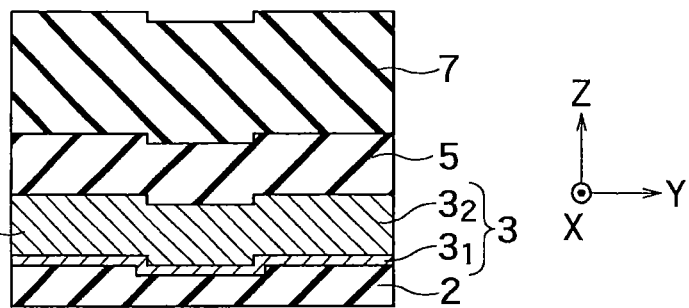
Figure 33D:
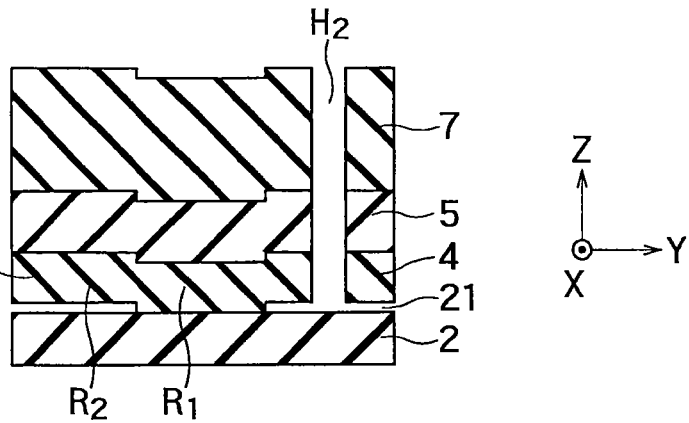

FIGS. 30A to 30D correspond to FIG. 8 to FIG. 8D. FIG. 8D illustrates the formation scheduled regions of the first regions $R_1$ having the first lower faces $S_{L1}$ and the first upper faces $S_{U1}$, and the formation scheduled regions of the second regions $R_2$ having the second lower faces $S_{L2}$ and the second upper faces $S_{U2}$. On the other hand, FIG. 30D illustrates the formation scheduled regions of the first regions $R_1$ having the first lower faces $S_{L1}$, the first faces $\sigma_1$, the second faces $\sigma_2$ and the first upper faces $S_{U1}$, and the formation scheduled regions of the second regions $R_2$ having the second lower faces $S_{L2}$ and the second upper faces $S_{U2}$.

Next, the process in FIGS. 9A to 9D to the process in FIGS. 18A to 18D are performed.

In the process of FIGS. 17A to 17D, the first, second and third sacrificial layers 21, 24 and 25 are removed by wet etching. As a result, the fifth air gaps 15 are formed in the regions from which the third sacrificial layer 25 is removed (refer to FIG. 24). Since the first, second and third sacrificial layers 21, 24 and 25 of the present embodiment are in contact with one another, similarly to the third air gaps 13, the fifth air gaps 15 are formed so as to be connected to the first and second air gaps 11 and 12.

After that, various inter layer dielectrics, interconnect layers and via plug layers and the like are formed on the substrate 1. In this way, the semiconductor device of the present embodiment is manufactured.

As described above, in the present embodiment, not only the third air gaps 13 are formed between the first insulator 2 and the second insulators 4, but also the fifth air gaps 15 are formed in the second insulators 4. Therefore, according to the present embodiment, as compared with the case where only the first to third air gaps 11 to 13 are formed between the conductors 3, the volume of the air gaps between the conductors 3 can be increased. Therefore, according to the present embodiment, the capacitance between the conductors 3 can be largely reduced more than in the case of the first embodiment.

The third sacrificial layer 25 of the present embodiment may be a layer other than the amorphous silicon layer as long as the third sacrificial layer 25 can be removed with the conductors 3 allowed to remain.

Moreover, the present embodiment may be used in combination with the second embodiment. Therefore, the semiconductor device of the present embodiment may have the third, fourth and fifth air gaps 13, 14 and 15 as well as the first and second air gaps 11 and 12.

Fourth Embodiment

FIGS. 31A to 33D are cross-sectional views illustrating a method of manufacturing a semiconductor device of a fourth embodiment.

FIGS. 31A to 31D illustrate cross sections of the same portions as those of FIGS. 4A to 4D, respectively. The same holds true for FIG. 32A to FIG. 33D.

First, the process in FIGS. 4A to 4D to the process in FIGS. 16A to 16D are performed.

Next, the third insulator 5, a fourth insulator 7 and a resist film 27 are sequentially formed on the conductor 3 and the second insulator 4 and holes $H_1$ are formed in the resist film 27 by lithography (FIGS. 31A to 31D). These holes $H_1$ are formed above the second insulators 4.

Next, the fourth insulator 7, the third insulator 5 and the second insulators 4 are etched using the resist film 27 as a mask (FIGS. 32A to 32D). As a result, holes $H_2$ which penetrate the fourth insulator 7, the third insulator 5 and the second insulators 4 to reach the first sacrificial layer 21 are formed. Examples of these holes $H_2$ are contact holes. After that, the resist film 27 is removed.

Next, the first and second sacrificial layers 21 and 24 are removed by wet etching using the holes $H_2$ (FIGS. 33A to 33D). As a result, the first and second air gaps 11 and 12 are formed in the regions from which the first sacrificial layer 21 is removed and the third air gaps 13 are formed in the regions from which the second sacrificial layer 24 is removed. Since the first and second sacrificial layers 21 and 24 of the present embodiment are in contact with each other, the third air gaps 13 are formed so as to be connected to the first and second air gaps 11 and 12.

After that, in the case where the holes $H_2$ are contact holes, contact plugs are formed in the holes $H_2$. Furthermore, various inter layer dielectrics, interconnect layers and via plug layers and the like are formed on the substrate 1. In this way, the semiconductor device of the present embodiment is manufactured.

As described above, in the present embodiment, the first, second and third air gaps 11, 12 and 13 are formed after the formation of the third insulator 5. According to the present embodiment, similarly to the first embodiment, as compared with the case where only the first and second air gaps 11 and 12 are formed between the conductors 3, the volume of the air gaps between the conductors 3 can be increased. Therefore, according to the present embodiment, the capacitance between the conductors 3 can be further largely reduced.

The present embodiment may be used in combination with the second and/or third embodiments. Therefore, the semiconductor device of the present embodiment may have the fourth and/or fifth air gaps 14 and 15 as well as the first, second and third air gaps 11, 12 and 13.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first insulator; and
conductors and second insulators alternately provided on the first insulator,
each second insulator of the second insulators comprising:
a first side face adjacent to one of the conductors via a first air gap;
a second side face adjacent to one of the conductors via a second air gap;
first lower faces in contact with the first insulator; and
second lower faces provided above the first insulator via third air gaps, the third air gaps being connected to the first and second air gaps.

2. The device of claim 1, wherein each second insulator alternately comprises first regions having the first lower faces and second regions having the second lower faces.

3. The device of claim 2, wherein a height of upper faces of the second regions is higher than a height of upper faces of the first regions.

4. The device of claim 1, wherein the first and second side faces of each second insulator are separated from the conductors.

5. The device of claim 1, wherein each conductor comprises:
a first conductor provided on the first insulator and providing a lower face and side faces of each conductor, and
a second conductor provided on the first conductor and providing an upper face of each conductor.

6. The device of claim 1, further comprising a third insulator provided on the conductors,
wherein each second insulator further comprises one or more upper faces provided below the third insulator via a fourth air gap.

7. The device of claim 6, wherein the fourth air gap is connected to the first and second air gaps.

8. The device of claim 6, wherein the one or more upper faces of each second insulator are separated from the third insulator.

9. The device of claim 1, wherein each second insulator has a shape surrounding fifth air gaps, and comprises first faces which are lower faces of the fifth air gaps and second faces which are upper faces of the fifth air gaps.

10. The device of claim 9, wherein each second insulator alternatively comprises first regions having the first lower faces, the first faces and the second faces and second regions having the second lower faces.

11. The device of claim 9, wherein the fifth air gaps are connected to the first and second air gaps.

* * * * *